(12) United States Patent
Hamzik et al.

(10) Patent No.: US 11,465,104 B2
(45) Date of Patent: Oct. 11, 2022

(54) LIGAND-MODIFIED FILTER AND METHODS FOR REDUCING METALS FROM LIQUID COMPOSITIONS

(71) Applicant: ENTEGRIS, INC., Billerica, MA (US)

(72) Inventors: James Hamzik, North Billerica, MA (US); Jad A. Jaber, Westford, MA (US); Justin Brewster, North Billerica, MA (US); Nicholas J. Filipancic, Medford, MA (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 16/779,181

(22) Filed: Jan. 31, 2020

(65) Prior Publication Data
US 2020/0254398 A1 Aug. 13, 2020

Related U.S. Application Data

(60) Provisional application No. 62/803,145, filed on Feb. 8, 2019.

(51) Int. Cl.
*B01D 71/82* (2006.01)
*B01D 71/36* (2006.01)
(Continued)

(52) U.S. Cl.
CPC ............ *B01D 71/82* (2013.01); *B01D 69/12* (2013.01); *B01D 71/36* (2013.01); *B01J 20/265* (2013.01);
(Continued)

(58) Field of Classification Search
CPC ........ B01D 71/82; B01D 71/36; B01D 69/12; B01D 2315/14; B01D 69/02; B01D 71/38; B01D 69/125; B01D 61/00; C02F 1/44; C02F 2103/346; C02F 2101/20; C02F 1/683; C02F 1/444; B01J 20/265;
(Continued)

(56) References Cited

U.S. PATENT DOCUMENTS

| 2,928,819 A | 3/1960 | Heinz |
| 5,547,760 A | 8/1996 | Tarbet |

(Continued)

FOREIGN PATENT DOCUMENTS

| CN | 102008900 A | 4/2011 |
| JP | 2002118065 A | 4/2002 |

(Continued)

OTHER PUBLICATIONS

Ting, T.M. et al; "Tuning N-methyl-D-glucamine density in a new radiation grafted poly(vinyl benzyl chloride)/nylon-6 fibrous boron-selective adsorbent using the response surface method"; The Royal Society of Chemistry 2015, 5, 37869-37880; Mar. 31, 2015.

(Continued)

*Primary Examiner* — Krishnan S Menon

(57) ABSTRACT

Described are filter materials including a polyol ligand, such as n-methylglucamine, and/or a polyphosphonic acid ligand, which are highly effective for filtering metals or metal ions from fluids. The filter materials can be particularly useful to filter basic and acidic fluid compositions, such as those used for wet etching, removing photoresist, and cleaning steps in microelectronic device manufacturing.

11 Claims, 9 Drawing Sheets

(51) Int. Cl.
  *B01D 69/12* (2006.01)
  *C02F 1/44* (2006.01)
  *B01J 20/26* (2006.01)
  *C09K 13/06* (2006.01)
  *B01J 20/28* (2006.01)
  *H01L 21/306* (2006.01)
  *B01J 20/30* (2006.01)
  *C02F 103/34* (2006.01)
  *C02F 101/20* (2006.01)

(52) U.S. Cl.
  CPC ... *B01J 20/28016* (2013.01); *B01J 20/28033* (2013.01); *B01J 20/3085* (2013.01); *C02F 1/44* (2013.01); *C09K 13/06* (2013.01); *H01L 21/30604* (2013.01); *C02F 2101/20* (2013.01); *C02F 2103/346* (2013.01)

(58) Field of Classification Search
  CPC ............ B01J 20/28033; B01J 20/28016; B01J 20/3085; C09K 13/06; H01L 21/30604
  See application file for complete search history.

(56) References Cited

U.S. PATENT DOCUMENTS

| | | | |
|---|---|---|---|
| 6,767,460 B1 * | 7/2004 | Clough | B01D 39/163 210/502.1 |
| 6,787,117 B1 | 9/2004 | Saito | |
| 2001/0003481 A1 | 6/2001 | Sugawara | |
| 2003/0018091 A1 | 1/2003 | Pafford | |
| 2005/0040109 A1 | 2/2005 | Smith | |
| 2007/0007196 A1 | 1/2007 | Komatsu | |
| 2009/0039019 A1 | 2/2009 | Raman | |
| 2011/0259818 A1 | 10/2011 | Tamada | |
| 2016/0310907 A1 | 10/2016 | Hanakawa | |
| 2018/0043313 A1 | 2/2018 | Onyemauwa | |

FOREIGN PATENT DOCUMENTS

| | | |
|---|---|---|
| JP | 2012040562 A | 3/2012 |
| TW | 200815101 A | 4/2008 |
| WO | 2008144115 A1 | 11/2008 |
| WO | 2016081729 A1 | 5/2016 |
| WO | 2017044668 A1 | 3/2017 |
| WO | 2017205722 A1 | 11/2017 |

OTHER PUBLICATIONS

Jrbano, B.F. et al.; "Water-insoluble polymer-clay nanocomposite ion exchange resin based on N-methyl-D-glucamine ligand groups for arsenic removal"; Reactive & Functional Polymers 72, pp. 642-649; 2012.

* cited by examiner

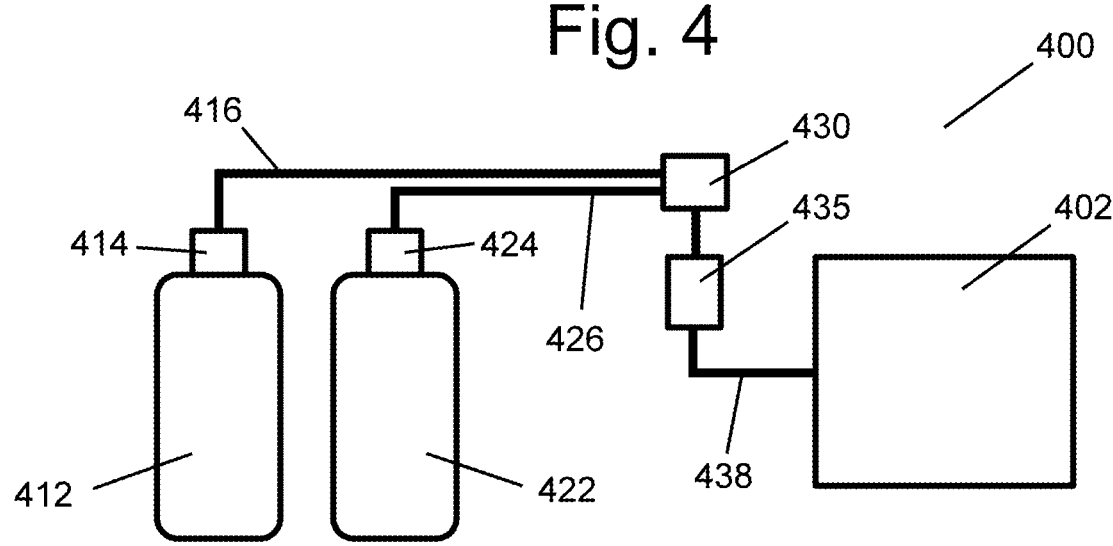
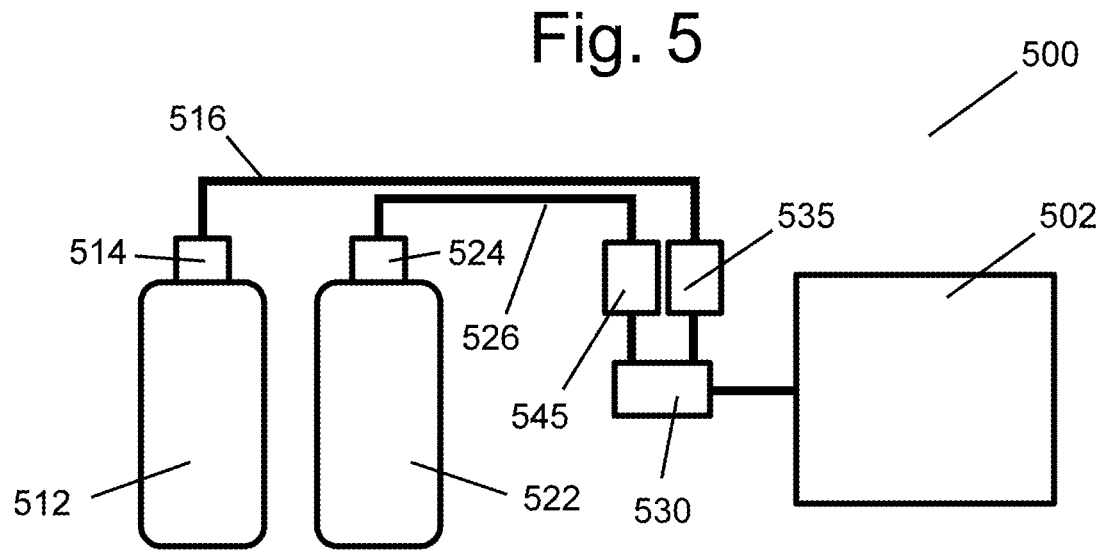

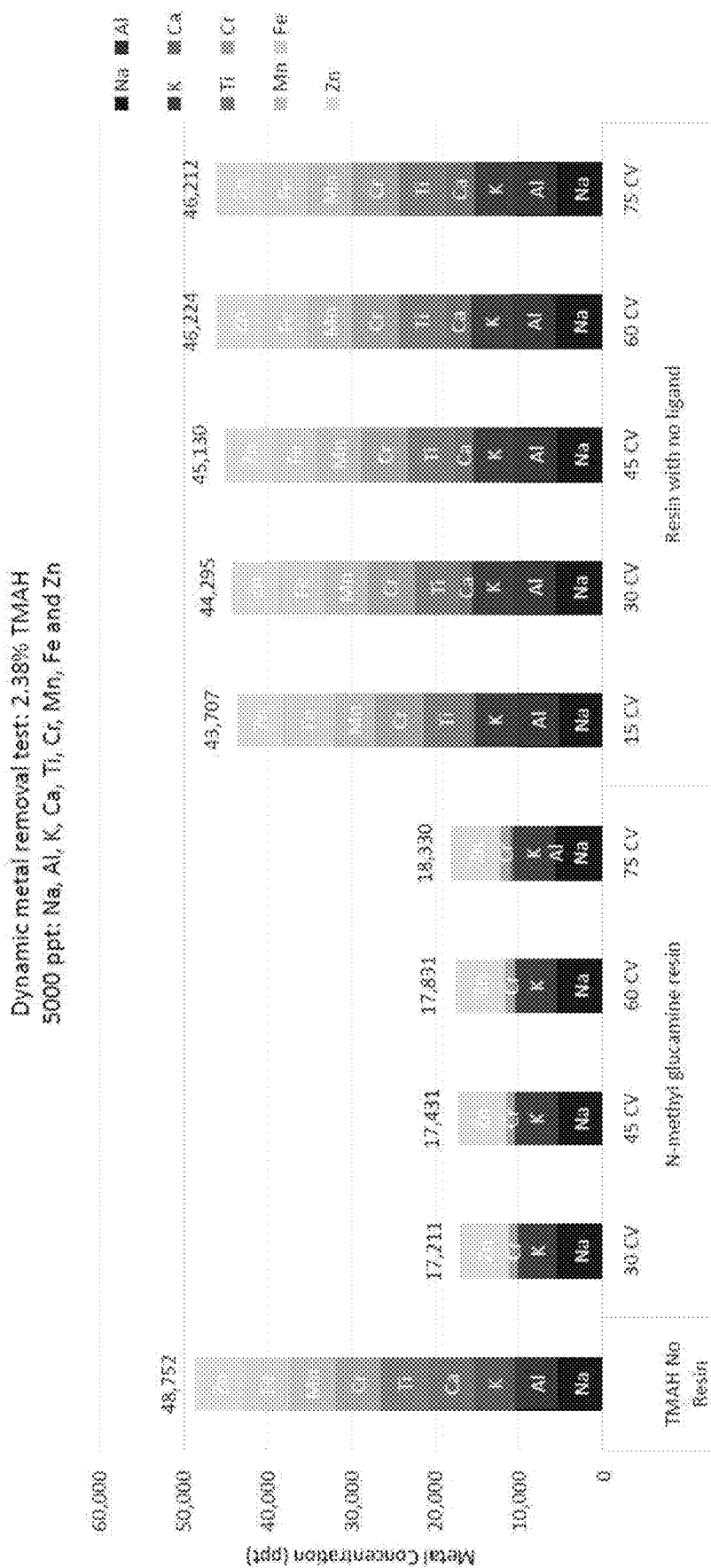

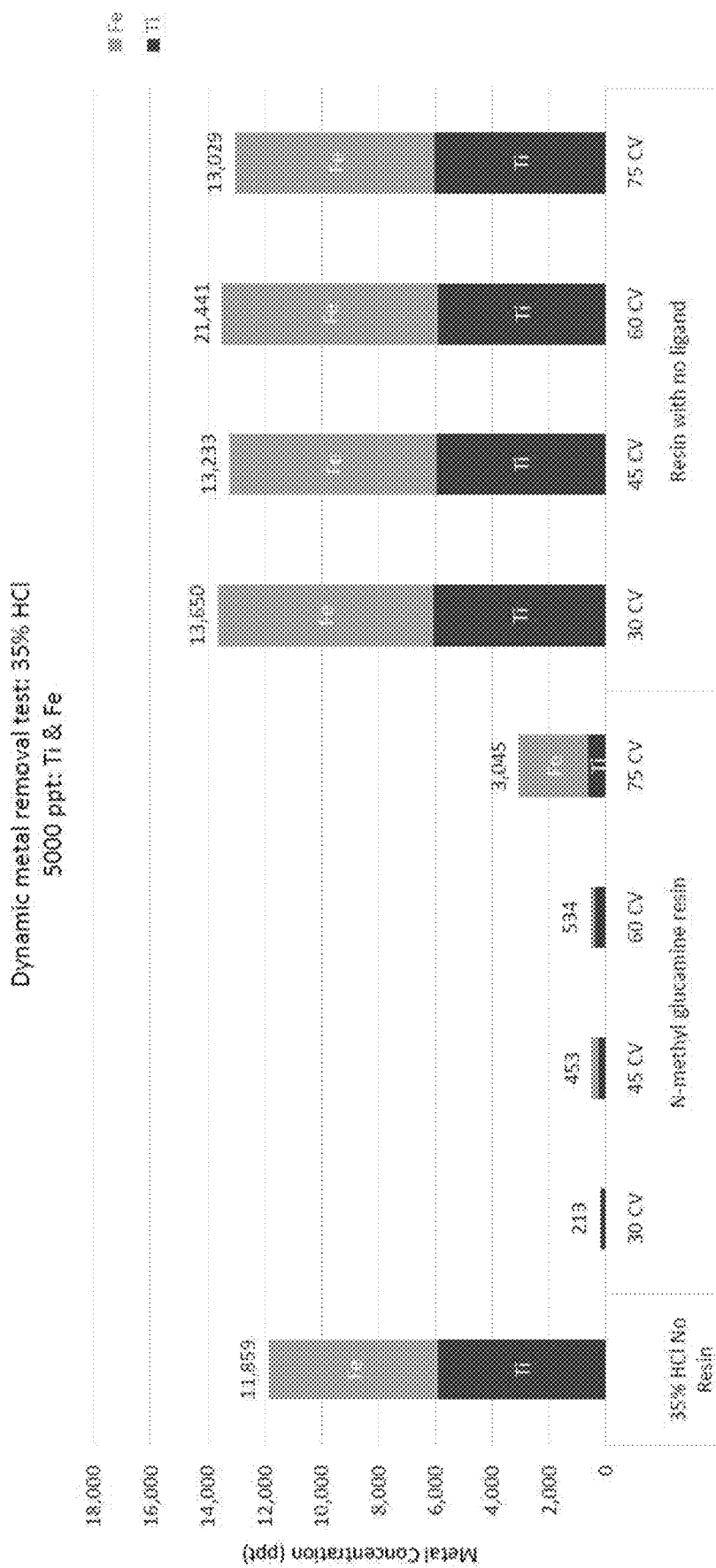

LIGAND-MODIFIED FILTER AND METHODS FOR REDUCING METALS FROM LIQUID COMPOSITIONS

CROSS-REFERENCE TO RELATED APPLICATIONS

This application claims the benefit under 35 USC 119 of U.S. Provisional Patent Application No. 62/803,145, filed Feb. 8, 2019, the disclosure of which is hereby incorporated herein by reference in its entirety.

FIELD OF THE INVENTION

The following description relates to ligand-modified articles, such as filter membranes, and to methods of using the articles for removing metals from liquid compositions.

BACKGROUND

Filters are used to remove unwanted materials from a flow of a useful fluid and have become important features in a wide variety of industrial technologies. Fluids that are treated to remove unwanted materials include water, liquid industrial solvents and processing fluids, industrial gases used for manufacturing or processing, and liquids that have medical or pharmaceutical uses. Unwanted materials that are removed from fluids include impurities and contaminants such as particles, microorganisms, and dissolved chemical species. Specific examples of filter applications include their use with liquid materials for semiconductor and microelectronic device manufacturing.

Filters can remove unwanted materials by a variety of different ways, such as by size exclusion or by chemical and/or physical interaction with material. Some filters are defined by a structural material providing a porous architecture to the filter, and the filter is able to trap particles of a size that are not able to pass through the pores. Some filters are defined by the ability of the structural material of the filter, or of a chemistry associated with the structural material, to associate and interact with materials that pass over the filter. For example, chemical features of the filter may enable association with unwanted materials from a stream that passes over the filter, trapping those unwanted materials such as by ionic, coordinative, chelation, or hydrogen-bonding interactions. Some filters can utilize both size exclusion and chemical interaction features to remove materials from a filtered stream.

In some cases, to perform a filtration function, a filter includes a filter membrane that is responsible for removing unwanted material from a fluid that passes through. The filter membrane may, as required, be in the form of a flat sheet, which may be wound (e.g., spirally), flat, pleated, or disk-shaped. The filter membrane may alternatively be in the form of a hollow fiber. The filter membrane can be contained within a housing or otherwise supported so that fluid that is being filtered enters through a filter inlet and is required to pass through the filter membrane before passing through a filter outlet.

The removal of ionic materials such as dissolved anions or cations from solutions is important in many industries, such as the microelectronics industry, where ionic contaminants and particles in very small concentrations can adversely affect the quality and performance of microprocessors and memory devices. In particular, it may be desirable to remove metal-containing materials such as metal ions from liquid compositions that are used for device fabrication. Metal-containing materials can be found in different types of liquids that are used for microelectronic manufacturing.

Some liquids used in microelectronic and semiconductor processing are acidic or basic. Acidic or basic solutions can be used as cleaning agents at various stages during a semiconductor fabrication method. Some commercially-obtained acidic or basic liquids used for such processes have amounts of metal ions that are not acceptable for use in semiconductor manufacture. Solutions containing unacceptable levels of metals that are brought into contact with semiconductors may otherwise foul the device material and impair performance of the semiconductor. In some instances, storage and/or shipment of these acidic or basic solutions can results in leaching of materials including metal materials from the containers which they are stored in, thereby necessitating point-of-use filtering for removing metals prior to use in the microelectronic manufacturing process.

There remain various unresolved technical challenges for the removal of metal-containing materials from fluids, especially those fluids that include basic or acidic solutions. Basic or acidic solutions can often "strip off" metal ions from conventional modified filters, such as those filters modified to have ion-exchange chemistries. Further, highly basic or acidic solutions can present aggressive chemical conditions for filtering processes. Even further, many filters have limited effectiveness for filtering both acidic and basic solutions.

SUMMARY

This disclosure provides various inventive embodiments that are directed to removal of metal contaminants from fluids, as well as ligand-modified filter materials useful for carrying out such methods. The filters and methods of this disclosure are particularly effective for removal of metals from basic or acidic liquid compositions. Filtered liquid compositions with significantly reduced amounts of metals can be used in a microelectronic manufacturing process, such as liquids for removing photoresist or liquids used in acid etching. The ligand-modified filters, such as ligand-modified porous membranes, can be configured for use in a microelectronic manufacturing system, which can be utilized in the system as a point of use metal-removal feature for liquids entering the system.

Accordingly, one aspect of the disclosure provides a method for removing one or more metal(s) or metal ion(s) from a liquid composition. The method comprises contacting a filter material with a liquid composition comprising one or more metal or metal ions, the filter material comprising (a) an polyol ligand comprising three or more hydroxyl groups, (b) a polyphosphonic acid ligand, or both (a) and (b). In contacting, the filter reduces an amount of the one or more metal or metal ions in the liquid composition.

In embodiments, the method can be used to filter an aqueous basic composition, such as one that includes tetramethyl ammonium hydroxide (TMAH), tetrabutyl ammonium hydroxide (TBAH), and/or $NH_4OH$, which are useful reagents for removing photoresist in a semiconductor manufacturing process. In embodiments, the method can be used to filter an aqueous acidic composition, such as one that includes hydrochloric acid, which is a useful reagent for acid etching of resist materials of semiconductor articles.

In some embodiments, the polyol ligand of the filter has four or five hydroxyl groups, and in some embodiments the polyol ligand includes an amine group (e.g., an amino polyol ligand). An exemplary amino polyol ligand is n-methylglucamine. In some embodiments, the polyphosphonic acid ligand is a diphosphonic acid ligand.

Accordingly, in another embodiment the method provides a method for manufacturing a microelectronic device. The method includes a step of performing filtering a liquid composition with the filter material comprising the polyol ligand and/or polyphosphonic acid ligand, as described herein. The metal- or metal ion-depleted liquid composition then contacts a microelectronic article in a step of manufacturing a microelectronic device.

In another embodiment, the disclosure provides a porous polymeric filter membrane that includes either (a) a polyol ligand comprising three or more hydroxyl groups, (b) a polyphosphonic acid ligand, or both (a) and (b). The membrane is configured for used in conjunction with a microelectronic fabrication system, for providing a metal- or metal ion-depleted liquid composition to the device. The porous polymeric filter membrane can be arranged in a housing, such as a cartridge, and in fluid communication with a fluid source used for semiconductor manufacturing, such as supply containers that include a basic aqueous composition or an acidic aqueous composition. In embodiments, the porous polymeric filter membrane is a component of a microelectronic fabrication system.

Experimental studies associated with the current disclosure have revealed that filter materials with immobilized polyol ligands or polyphosphonic acid ligands as described herein provide excellent reduction in the metal and/or metal ion contamination in fluid processing streams as compared to convention ion-exchange ligands. Surprising, these ligand-modified membranes of the disclosure performed removal of metal materials very well in various basic (such as TMAH-containing) and acidic (such as HCl-containing) conditions. Beneficially, these ligand-modified membranes can be used in systems and methods that require metal removal from both basic and acidic solutions. Metal removal can be carried out without requiring separate filtration members for supply compositions.

BRIEF DESCRIPTION OF THE DRAWINGS

FIG. 4 is a schematic illustration of an exemplary semiconductor fabrication system including a filter having a ligand of the disclosure, and acidic and basic processing solutions.

FIG. 5 is a schematic illustration of an exemplary semiconductor fabrication system including two filters having ligands of the disclosure, and acidic and basic processing solutions.

FIG. 6 is a graph showing reduction of metal from a tetramethyl ammonium hydroxide (TMAH) solution using a N-methylglucamine-modified porous polymeric resin and resins without any ligand.

FIG. 7 is a graph showing reduction of metal from a hydrochloric acid (HCl) solution using a N-methylglucamine-modified porous polymeric resin and resins without any ligand.

DETAILED DESCRIPTION

Figure 1:
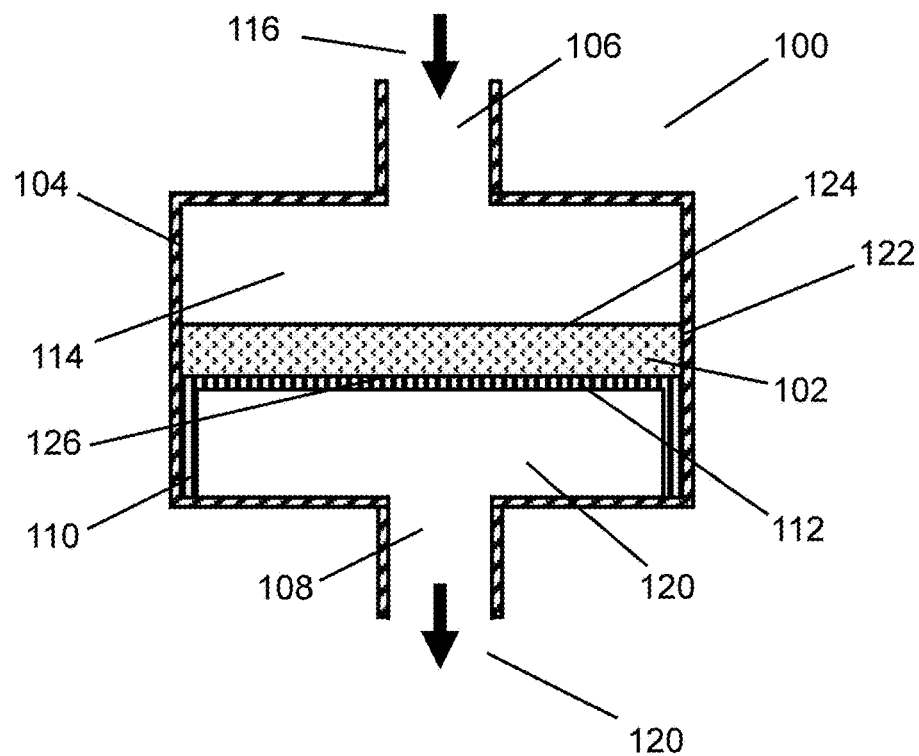
FIG. 1 is an illustration of an exemplary cross-section of a filter with a single porous membrane having a ligand of the disclosure.

The disclosure illustrates various embodiments for methods of removing metal contaminants from fluids, wherein the ligand of the filter material includes (a) a polyol ligand, (b) a polyphosphonic acid ligand, or both types of ligands (a) and (b). Fluid composition can be passed through the ligand-modified filter material to effectively remove metal contaminants to levels suitable for a desired application. One application that can use the ligand-modified filter materials of the current disclosure is semiconductor manufacturing, such as for the purification of metals from basic and acidic solutions that are used for etching and cleaning semiconductor materials.

A filter material on which the polyol ligand, polyphosphonic acid ligand, or both, is attached, can be made of any suitable material or combination of materials. For example, exemplary filter materials can include one or more of a polymer, a metal, a ceramic, or a natural material. Further, in some aspects, the material of the filter can have a chemistry suitable for attachment to the polyol ligand or polyphosphonic acid ligand. Alternatively, the surface of the filter material can be modified so that it is chemically reactive with the polyol ligand or polyphosphonic acid ligand.

A "filter," refers to an article having a structure that includes filter material. For example, the filter can be in any useful form for a filtering process, including the form of a porous membrane, a bead, a tube, etc., the filter being made from one or more filter materials such as polymers, including synthetic and natural polymers, metal-containing materials, such as alloys, natural materials, ceramic, carbon fiber, etc. In some embodiments, the polyol ligand and/or polyphosphonic acid ligand can be attached to the filter material.

The filter can be in any desired form suitable for a filtering application. Material that forms the filter can be a structural component of a filter itself and that provides the filter with a desired architecture. The filter can be porous or non-porous and can be of any desired shape or configuration. The filter per se can be a unitary article or can be represented by a plurality of individual articles, such as particles (e.g., resin beads).

In some embodiments, the filter material is formed from a polymeric material, a mixture of different polymeric materials, or a polymeric material and a non-polymeric material. Polymeric materials forming the filter can be crosslinked together to provide a filter structure with a desired degree of integrity.

Polymeric materials that can be used to form filter material of filters of the disclosure include hydrophobic polymers. In some embodiments, the filter material includes a polyolefin or a halogenated polymer. Exemplary polyolefins include polyethylene (PE), polypropylene (PP), polymethylpentene (PMP), polybutene (PB), polyisobutylene (PIB), and copolymers of two or more of ethylene, propylene, and butylene. In a particular embodiment, filter material includes ultra-high molecular weight polyethylene (UPE). UPE filter materials, such as UPE membranes, are typically formed from a resin having a molecular weight greater than about $1 \times 10^6$ Daltons (Da), such as in the range of about $1 \times 10^6$-$9 \times 10^6$ Da, or $1.5 \times 10^6$-$9 \times 10^6$ Da. Crosslinking between polyolefin polymers such as polyethylene can be promoted by use of heat or crosslinking chemicals, such as peroxides (e. g. dicumyl peroxide or di-tert-butyl peroxide), silanes (e.g. trimethoxyvinylsilane), or azo esters compounds (e.g., 2,2'-azo-bis(2-acetoxy-propane). Exemplary halogenated polymers include polytetrafluoroethylene (PTFE), polychlorotrifluoro-ethylene (PCTFE), fluorinated ethylene polymer (FEP), polyhexafluoropropylene, and polyvinylidene fluoride (PVDF).

In other embodiments, the filter material includes a polymer selected from the group consisting of polyamide, polyimide, polysulfone, polyether-sulfone, polyarylsulfone polyamides, polyacrylates, polyesters, nylons, celluloses, polycarbonates, or combinations thereof.

The polymeric material can be modified, in some modes of practice, to facilitate modification of the filter material with the polyol ligand or polyphosphonic acid ligand. The polyol ligand or polyphosphonic acid can include an amine group which can facilitate attachment to a polymeric filter material. If the polymeric material is not inherently amine-reactive, it can be modified such as by halogenation or haloalkylation to provide a surface-reactive chemistry for the attachment of an amino polyol ligand or amino polyphosphonic acid ligand.

In some modes of practice, polymeric material of the filter is halogenated to provide amine-reactive sites. For example, polyethylene can be chlorinated by reacting gaseous chlorine at temperatures of greater than 50° C., optionally diluted with inert gas(es), with solid polyethylene powder (e.g., see U.S. Pat. No. 2,928,819).

In another mode of practice, the polymer of the filter material can be haloalkylated, such as chloromethylated. Chloromethylation is a known technique used for modifying polymers and generally uses a chloromethylation reagent (e.g., bis-chloromethyl ether (BCME); chloromethyl methyl ether (CMME); formaldehyde/methanol/hydrogen chloride/chlorosulfonic acid). Lewis acid and Friedel-Crafts catalysts, such as zinc chloride, zinc oxide, or ferric chloride, can be used with the chloromethylation reagents at elevated temperatures to modify the polymer (see, for example, US2003/0018091 (Pafford et al.) and WO2008/144115 (Harris et al.)). To provide the ligand of the disclosure on the filter, the haloalkyl group of the haloalkyl-modified filter material can be reacted with an amine polyol or an amine polyphosphonic acid resulting in covalent bonding of ligand to the surface of the filter material.

In another mode of practice, the polyol ligand or polyphosphonic acid ligand can be attached to a filter material through attachment with a reactive cross-linked coating. For example, the filter material can be coated with an amine reactive polymer such as poly(vinylbenzyl chloride), poly (epichlorohydrin), or an epoxy resin. The coated filter material can then be cross-linked and the remaining reactive sites used for attachment of the desired ligand. For example, poly(vinylbenzyl chloride) can be dissolved in a suitable solvent, dried onto a porous membrane, cross-linked with a diamine, polyamine, or any other multifunctional reactive cross-linker, followed by attachment of an amine containing polyol ligand or polyphosphonic acid ligand. Using a similar method, the cross-linking and ligand attachment can happen simultaneously. Alternatively, the amine reactive polymer can be crosslinked via irradiation or through use of photo-initiator crosslinking, followed by attachment of the amine containing ligand.

In another mode of practice, the ligand attachment can occur prior to coating on the filter material. For example, a polyol or polyphosphonic acid functionalized polymer can be prepared by reacting an amino polyol or amino polyphosphonic acid ligand with a polymeric material having a functional group reactive with the amine of the ligand (such as poly(vinyllbenzyl chloride)). The filter material can then be coated with the resulting polyol or polyphosphonic acid ligand modified polymer and dried. Optional crosslinking techniques may also be used.

In another mode of practice, the filter material can be coated with the desired polyol ligand or polyphosphonic acid ligand via monomer cross-linking. For example, the desired polyol ligand or polyphosphonic acid can be in the form of a reactive monomer bearing acrylamide, vinyl, or other suitable unsaturated groups. An example of a reactive monomer bearing a polyphosphonic acid is vinylidene diphosphonic acid, and an example of a reactive monomer bearing a polyol is the reaction product of vinylbenzyl choloride and N-methyl glucamine. The polyol or polyphosphonic acid containing monomers can be added to monomer formulations containing di-functional monomers, such as, N, N'-methylenebisacrylamide. These monomer formulations can also contain photo-initiators, such as, OMNIRAD 2959 (1-[4-(2-hydroxyethoxy)-phenyl]-2-hydroxy-2-methyl-1-propane-1-one). Once the membrane is imbibed with the resulting monomer solution the membrane can be irradiated (ultraviolet, electron beam, gamma, etc.) to form a cross-linked coating with the desired polyol ligand or polyphosphonic acid ligand incorporated into the coating (see, for example, WO2017/205722 (Jaber et al.)).

In another mode of practice, the desired polyol ligand or polyphosphonic acid ligand can be attached to a filter material via grafting from the membrane. "Grafting from" can be accomplished by irradiation of the filter material in the presence of a photo-initiator and an unsaturated monomer containing the desired the polyol ligand or polyphosphonic acid ligand (see, for example, WO2016/081729 A1 (Jaber et al.)). In another mode of practice, the filter material can be attached with the desired polyol ligand or polyphosphonic acid ligand via grafting from the membrane using electron beam or gamma irradiation. Grafting using electron beam or gamma irradiation can be accomplished using techniques known as pre-irradiation grafting or simultaneous irradiation grafting.

In another mode of practice, the filter material can be embedded with resin particles to form a hybrid particle/membrane filter material. For example, porous poly(styrene-co-divinylbenzene) resin particles having the desired polyol ligand or polyphosphonic acid ligand attached can be introduced to a polymer mixture used for membrane extrusion or membrane casting. Using this method, the resulting porous polymeric membrane would have embedded porous particles with the desired polyol ligand or polyphosphonic acid ligand attached. In some embodiments, the resulting membrane can have a tight particle retentive membrane placed downstream of the porous particle containing membrane (see, for example, US 2009/0039019 A1 (Raman)).

The concentration of polyol ligand, polyphosphonic acid ligand, or a combination thereof, can be sufficient to allow the ligand(s) to be immobilized on a surface of the filter material at a desired density. A ligand solution can be applied to surfaces of filter material by any useful technique, such as by spraying, submerging, soaking the filter material solution, or the like. Desirably, the entire surface of the filter can be contacted with the solution, such as all internal surfaces of a porous filter membrane. If necessary the application step may include manipulation of the filter material, e.g., by rolling or squeezing a porous filter medium to cause wetting of all surfaces of the porous filter.

In various examples of methods and devices of the present description, the filter includes a porous filter membrane with the polyol ligand and/or polyphosphonic acid ligand attached to material that forms the membrane. As used herein, a "porous filter membrane" is a porous solid that contains porous (e.g., microporous) interconnecting passages that extend from one surface of the membrane to an opposite surface of the membrane. The passages generally provide tortuous tunnels or paths through which a liquid being filtered must pass. Metal species of sizes small enough to pass through the pores of the membrane can be trapped on the membrane by interaction with the polyol ligand and/or polyphosphonic acid ligand, such as by a chelation interaction between the ligand and the metal. This is referred to as a "non-sieving filtration mechanism."

The filter can also function to prevent any particles (e.g., metal containing particles) present within the liquid that are larger than the pores from entering the microporous membrane or can function to trap the particles within the pores of the microporous membrane (i.e., wherein particles are removed by a sieving-type filtration mechanism). The liquid to be treated (e.g., an acidic or basic solution) can pass through the membrane resulting in flow-through having a reduced amount of metals, such as a reduced amount of ionic metal species, a reduced amount of metal-containing particulates, or both.

Accordingly, a porous polymeric membrane on which the polyol ligand, polyphosphonic acid ligand, or both, is attached can remove metal and metal ion contaminants in a solution that is passing through the membrane, as well as any material that is of a size too large to pass through the pores of the membrane.

Porous membranes of the disclosure can be described with reference to one or more properties of the membrane. Example porous polymeric filter membranes as described herein can be characterized by physical features that include pore size, bubble point, and porosity. For example, the membrane can be described in terms of bubble point, which is commonly used to reflect pore size.

The bubble point method is based on the premise that, for a particular fluid and pore size with constant wetting, the pressure needed to force an air bubble through the pore is in inverse proportion to the size of the hole. The diameter of the capillary can be calculated by determining the pressure required to force water out of the capillary. Methods for determining bubble point can include wetting the membrane, applying pressure to the membrane, and then determining at what pressure point bubbles are emitted from the upper surface of the membrane. A standard method for a bubble-point is set forth in American Society for Testing and Materials Standard (ASMT) Method F316. In aspects of the disclosure, the porous polymeric membrane can have a bubble point in the range of from about 2 psi to about 400 psi, about 4 psi to about 200, or preferably about 4 psi to about 160 psi, when ethoxy-nonafluorobutane (HFE-7200) is used as the wetting solvent, and at a temperature of 20-25 degrees Celsius.

Alternatively, pore size can be measured by known techniques such as by Mercury Porosimetry (MP), Scanning Electron Microscopy (SEM), Liquid Displacement (LLDP), or Atomic Force Microscopy (AFM).

The porous polymeric filter membrane can have any pore size that will allow the filter membrane to be effective for performing as a filter membrane. The pore size can be correlated with bubble point determination. In some embodiments, porous membranes can have an average pore size in a range of from about 0.001 microns to about 5 or 10 microns, e.g., from 0.01 to 0.8 microns. The average pore size can be selected based on one or more factors that include: fluid flow rate, pressure, pressure drop considerations, viscosity considerations, impurities in the liquid to be treated (such as amount of metal impurities), and any particle size of the impurities.

Further, the disclosure contemplates use of polymeric membranes with generally uniform pore sizes resulting from a higher degree of pore symmetry, as well as membranes with non-uniform pore sizes (variable pore diameters) resulting from pore asymmetry. Pores can be isotropic or anisotropic, skinned or unskinned, symmetric or asymmetric, and any combination of these.

A porous polymer filter layer as described may have any porosity that will allow the porous polymer filter layer to be effective as described herein. Example porous polymer filter layers can have a relatively high porosity, for example a porosity of at least 60, 70 or 80 percent. As used herein, and in the art of porous bodies, a "porosity" of a porous body (also sometimes referred to as void fraction) is a measure of the void (i.e. "empty") space in the body as a percent of the total volume of the body, and is calculated as a fraction of the volume of voids of the body over the total volume of the body. A body that has zero percent porosity is completely solid.

A filter membrane of the present description can be useful with any type of industrial process that requires a high purity liquid material as an input. Non-limiting examples of such processes include processes of preparing microelectronic or semiconductor devices, a specific example of which is a method of filtering a basic or acidic liquid process material used for semiconductor photolithography. The filters of the current disclosure can remove metal ions and metal-containing particulates from a basic or acidic process liquid or solvent used for preparing microelectronics or semiconductors and may also remove other non-metal particulate material by the sieving action of the membrane.

Porous membranes of the disclosure can be of any desired geometric configurations suitable for use in a system for reducing metal or metal ion contamination in a fluid stream. For example, the porous membranes described of the disclosure can have any one or more of a variety of geometric configurations or forms. For example, the porous membrane can have any one or more shapes selected from circular, semi-circular, oval, semi-oval, or polygonal such as square, rectangular, hexagonal, or octagonal, etc. The porous membrane can be in the form of a flat sheet, a corrugated sheet, a pleated sheet, and a hollow fiber, among others.

A porous polymeric filter membrane as described can be in the form of a sheet or hollow fiber having any useful thickness, e.g., a thickness in a range from 20 to 400 microns, e.g., from 40 or 80 to 100 or 200 microns.

The polyol ligand or/and polyphosphonic acid ligand can also be immobilized on filter material that is in the form of filter particles. The filter particles can be referred to as "resins," or "polymeric resins" and can be formed by precipitation, grinding, or milling, such as to form resin particles with sizes in the range of about 5 to about 600 microns, or about 8 to about 75 microns, or about 8 to about 20 microns. The distribution of particle sizes can vary; however, in some embodiments it can be less than about ±25%, in other embodiments it can be less than about ±10%.

Embodiments of the disclosure include a filter which has been modified to include a polyol ligand. The filter can have a surface that contacts liquid during a filtering process, and the surface presents the polyol ligands. In some instances, the polyol ligand is an amino polyol ligand, and an amino polyol ligand-modified surface of a filter can be represented by the following formula: $M_F$-N-P, wherein $M_F$ is material of the filter, N is nitrogen, and P represents the polyol portion of the amino polyol ligand. In other instances, an amino polyol ligand-modified surface can be represented by $M_F$-L-N-P, wherein $M_F$, N, and P have the definitions herein, and L is a chemical linker linking the amino polyol to filter material. In embodiments, the amino polyol ligand is covalently attached to the filter material, which may be a polymer such as a polyolefin, as described herein. In other embodiments, an amino polyol ligand-modified surface can be represented by Poly-N-P, wherein N and P have the definitions herein and Poly is a polymeric backbone to which the polyol is attached. For this embodiment, the filter material is internally coated by a modified polymer coating, which may also be crosslinked.

"Amino polyol ligands" of the disclosure refer to chemical moieties including a nitrogen and a polyol portion having three or more hydroxyl groups. Examples of amino polyols having three hydroxyl groups include 3-aminobutane-1,2,4-triol (threosaminitol), 4-aminobutane-1,2,3-triol, methylaminoglycerol (1-(methylamino)propane-1,2,3-triol), 2-(methylamino)propane-1,2,3-triol, 5-aminopentane-1,2,4-triol, and 5-aminopentane-1,2,3-triol.

Examples of amino polyols having four hydroxyl groups include 1-aminopentane-1,2,3,5-tetrol, 1-aminopentane-1,1,2,2-tetrol, 1-amino-2,2-bis(hydroxymethyl)propane-1,3-diol, 1-aminohexane-2,3,4,5-tetrol, 1-(methylamino)hexane-2,3,4,5-tetrol, 2-aminopentane-1,2,4,5-tetrol, 2-aminopentane-1,2,3,4-tetrol, 3-aminopentane-1,2,4,5-tetrol, 4-aminopentane-1,1,2,3-tetrol, 4-aminopentane-1,2,3,5-tetrol, 5-aminopentane-1,2,3,4-tetrol (ribamine; 1-amino-1-deoxypentitol), 5-aminopentane-1,1,1,5-tetrol, 6-aminohexane-1,2,3,4-tetrol, and 6-(methylamino)hexane-1,2,4,5-tetrol.

Examples of amino polyols having five hydroxyl groups include 1-aminopentane-1,2,3,4,5-pentol, 1-(methylamino)hexane-1,2,3,4,6-pentol, 5-(methylamino)hexane-1,2,3,4,6-pentol, 6-aminohexane-1,2,3,4,5-pentol, 5-(methylamino)hexane-1,2,3,4,6-pentol, 6-(methylamino)hexane-1,2,3,4,5-pentol (n-methylglucamine), 1-deoxy-1-(methylamino)-D-glucitol), and 6-(butylamino)hexane-1,2,3,4,5-pentol.

Examples of amino polyols having six hydroxyl groups include 6-(3-hydroxypropyl amino)hexane-1,2,3,4,5-pentol, 6-(2-hydroxyethylamino)hexane-1,2,3,4,5-pentol, 6-(2-hydroxyethylamino)hexane-1,2,3,4,5-pentol, 1-(propylamino)hexane-1,2,3,4,5,6-hexol, 6-(methylamino)hexane-1,1,2,3,4,5-hexol, 7-(methylamino)heptane-1,2,3,4,5,6-hexol, and 7-(propylamino)heptane-1,2,3,4,5,6-hexol.

Examples of amino polyols having seven hydroxyl groups include 6-(2,3-dihydroxypropylamino)hexane-1,2,3,4,5-pentol, 1-(ethylamino)hexane-1,1,2,3,4,5,6-heptol, 1-(2-hydroxyethylamino)hexane-1,2,3,4,5,6-hexol, and 8-(methylamino)octane-1,2,3,4,5,6,7-heptol.

Examples of amino polyols having more than seven hydroxyl groups include 6-(2,2,2-trihydroxyethylamino)hexane-1,2,3,4,5-pentol, 1-(2,3-dihydroxypropylamino)hexane-1,2,3,4,5,6-hexol, and 6-(2,3,4,5,6-pentahydroxyhexylamino)hexane-1,2,3,4,5-pentol.

The current disclosure also contemplates all enantiomers and stereoisomers of the amino polyols, such as described herein.

Embodiments of the disclosure include a filter which has been modified to include a polyphosphonic acid ligand. A "polyphosphonic acid ligand" refers to a chemical moiety that includes two or more phosphonic acid groups and which is attached to the filter material. In some embodiments, the ligand is an amino polyphosphonic acid, which includes two or more phosphonic acid groups and at least one amine group. In some instances, an amino polyphosphonic ligand-modified surface of a filter can be represented by the following formula: $M_F$-N-PP, wherein $M_F$ is material of the filter, N is nitrogen, and PP represents the polyphosphonic acid portion of the ligand. In other instances, an amino polyol ligand-modified surface can be represented by $M_F$-L-N-PP, wherein $M_F$, N, and PP have the definitions herein, and L is a chemical linker linking the polyphosphonic acid portion to filter material. In embodiments, the polyphosphonic acid ligand is covalently attached to the filter material, which may be a polymer such as a polyolefin, as described herein. In other embodiments, an amino polyol ligand-modified surface can be represented by Poly-N-P, wherein N and P have the definitions herein and Poly is a polymeric backbone to which the polyol is attached. For this embodiment, the filter material is internally coated by a modified polymer coating, which may also be crosslinked.

Examples of amino polyphosphonic acid ligands include 1-(aminoethylidene)-1,1-diphosphonic acid, 4-amino-1-hydroxybutane-1, (4-amino-1,1,1-trihydroxy-2-phosphonobutan-2-yl)phosphonic acid, (1-amino-1,1-pentanediyl)bis(phosphonic acid), (1-amino-1,1-heptanediyl)bis(phosphonic acid), and (1-amino-1,3-propanediyl)bis(phosphonic acid).

Other examples of polyphosphonic acid ligands include 1-biphosphonic acid (alendronic acid), iminodi(methylphosphonic acid), [amino(phosphono)methyl]phosphonic acid, diethylenetriaminepentakis(methylphosphonic acid), and nitrilotri(methylphosphonic acid).

Porous membranes of the disclosure can be associated with a support structure, a housing, or both. For example, the coated porous membrane can be supported by a frame, bracket, clip, web, net, and cage, and the like. In some constructions, at least part of the support structure can be a housing, as described herein. Alternatively, the porous membrane is unsupported.

The porous membrane can be present as a part of a filter assembly that includes a housing. For example, the housing is fluidically sealed (aside from inlet and outlet ports) and able to hold a volume of liquid and configured to allow the liquid to pass through the membrane. A housing can be used to form a larger filter structure such as a filter assembly (single or multilayer) or a filter cartridge that is used in a filtering system. The filtering system will place the filter membrane, e.g., as part of a filter assembly or as part of a filter cartridge, in a filter housing to expose the filter membrane to a flow path of a liquid chemical to cause at least a portion of the flow of the liquid chemical to pass through the filter membrane, so that the filter membrane removes an amount of the impurities or contaminants from the liquid chemical. The structure of a filter assembly or filter cartridge may include one or more of various additional materials and structures that support the composite filter membrane within the filter assembly or filter cartridge to cause fluid to flow from a filter inlet, through the filter material (e.g., filter membrane), and through a filter outlet. The filter membrane supported by the filter assembly or filter cartridge can be in any useful shape, e.g., a pleated cylinder, a cylindrical pad, one or more non-pleated (flat) cylindrical sheets, a pleated sheet, among others.

An embodiment of the disclosure includes a filter device and a method of removing metal contaminants from a liquid, such as a base-containing liquid or an acid-containing liquid, wherein the liquid is passed through a porous polymeric membrane that has the amino polyol ligand or/and the polyphosphonic acid ligand. As shown in FIG. 1, the disclosure provides a filter 100 that includes a porous polymeric membrane 102. The porous polymeric membrane 102 includes an amine polyol ligand, a polyphosphonic acid ligand, or a combination thereof immobilized on a surface of the membrane. The filter 100 can have a housing 104 that provides a structure to the filter 100 and that fluidically seals an internal portion of the filter. The housing 104 can be any shape and size, such as cylindrical, polygonal, etc.

One portion of the filter can include an inlet port 106, to receive a metal/metal ion-containing fluid composition to be filtered. The inlet port 106 can be configured to be connected to a fluid supply line, such as a fluid supply line that provides an aqueous basic composition, or an aqueous acidic composition (not shown). As such, the inlet port 106 can include a valve, a gasket, etc. (not shown) to facilitate connection to a fluid supply. The metal/metal ion-containing fluid composition to be filtered can flow through inlet port 106 in direction indicated by arrow 116, and into a headspace 114 in the filter 100, as defined by an input-facing surface 124 of porous polymeric membrane 102, the internal surface of the housing 104, and the inlet port 106. In embodiments, the filter can be constructed so the headspace has a volume that is a desired percentage of the total internal volume of the filter.

The internal portion of the filter can include the porous membrane in any suitable placement or arrangement, with FIG. 1 showing the porous polymeric membrane 102 having a disc-like architecture (a cross-sectional view is shown). A side 122 of the porous polymeric membrane 102, such as the outer circumference of the membrane, can be in contact with the inner surface of the housing 104. The porous polymeric membrane 102 can also have an input-facing surface 124, which first contacts the metal/metal ion-containing fluid, and an output-facing surface 126, from which treated fluid with reduced amounts of metal/metal ions flow. Aspects of the filter can optionally be described in terms of the range of the ratio of the surface area of the input-facing surface 124 to the volume of the porous polymeric membrane 102, or the ratio of the surface area to the thickness of the filter.

The filter 100 can also include one or more features that support the porous polymeric membrane 102 within the filter. Any arrangement for supporting the filter can be used and can include one or more distinct structural feature(s), such as a frame, frame, bracket, clip, web, net, and cage, and the like, or a material such as an adhesive can be used to support the membrane. A combination of an adhesive and a structural supporting feature can be used. In an embodiment, and with reference to FIG. 1, the filter includes a frame having frame portions 110 and 112, with frame portion 110 in contact with the inner surface of the housing 104, which is attached to portion 112. Portion 112 can be in contact with the output-facing surface 124 of the porous polymeric membrane 102 and can provide support to the membrane during filtering. Frame portion 112 can have a grid-like structure to freely allow filtered liquid to pass into the backspace 120 of the filter, while still providing structural support to the polymeric porous membrane under increased fluidic pressures.

In use, a liquid, such as an aqueous basic composition (e.g., including TMAH, TBAH, or ammonia hydroxide), or an aqueous basic composition (e.g., including HCl, such as concentrated HCl having greater than 10% HCl) enters the filter through inlet port 106 in direction indicated by arrow 116, and then fills the headspace 114 within the filter 100. Sufficient fluidic pressure is applied to cause the fluid to move through the porous polymeric membrane at a desired flow rate.

Exemplary flow rates for porous membranes are in the range of about 0.1 L/min to about 40 L/min, or more preferably about 5 L/min to about 20 L/min. Alternatively, the flow rate for a porous membrane is expressed in terms of the amount of liquid flowed per area of the filter per time (e.g., Liter/$m^2$/h=LMH), such as about 100 LMH/bar to about 30,000 LMH/bar, or more preferably about 5,000 LMH/bar to about 15,000 LMH/bar.

In some embodiments, the filter of the disclosure includes a composite membrane arrangement. For example, a filter with a composite membrane can include two or more filter materials, such as two or more filter articles. For example, the filter can include a first porous polymeric membrane that includes one of the polyol ligand or the polyphosphonic acid ligand, and a second filter material that does not include the ligand present in the first porous polymeric membrane (the polyol ligand or the polyphosphonic acid ligand) or that is in some way different from the first porous polymeric membrane. The second filter material can also be in the form of a porous membrane, or can be different, such as having a non-porous form. The second filter material can be made of the same or of a different polymeric material than the first membrane, and can either be modified, such as modified with a ligand not present in the first membrane (e.g., the polyol ligand or the polyphosphonic acid ligand), or unmodified.

In some embodiments, the filter includes a first porous polymeric membrane that includes the polyol ligand, and a second porous polymeric membrane that includes the polyphosphonic acid ligand. In other embodiments, the filter includes a first porous polymeric membrane that includes the polyphosphonic acid ligand, and a second porous polymeric membrane that includes the polyol ligand. In embodiments, the first and second porous polymeric membranes are constructed from the same or a similar polymeric material and have the same or a similar pore size. In other embodiments, the first and second porous polymeric membranes are constructed from the different polymeric materials and/or have different pore sizes.

Figure 2:
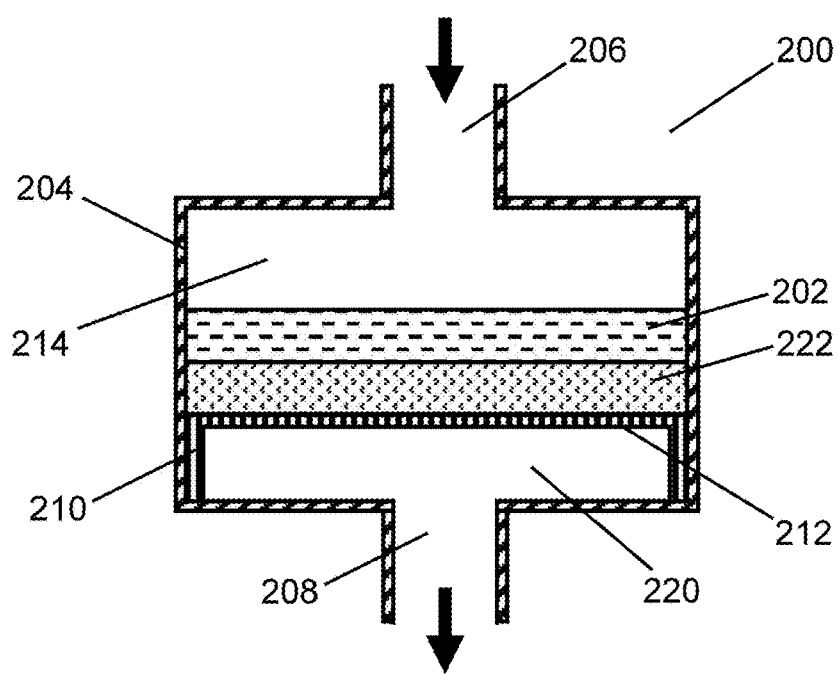
FIG. 2 is an illustration of an exemplary cross-section of a composite filter with a first porous membrane having an amino polyol ligand, and a second porous membrane having a polyphosphonic acid ligand.

An example of a filter with a composite membrane is shown in FIG. 2. Filter 200 includes a first porous polymeric membrane 202 and fluidically distal second porous polymeric membrane 222. The polymeric membranes 202/222 can be in a stacked arrangement with the output-facing surface of the first porous polymeric membrane 202 in direct contact with the input-facing surface of the second porous polymeric membrane 222. The first and second porous polymeric membranes 202/222 have attached thereto the amino polyol ligand, and the polyphosphonic acid ligand, respectively, or vice versa. The filter 200 can have a housing 204, inlet port 206, a headspace 214, a frame having frame portions 210 and 212, to support the membranes during filtering, a backspace 220, and an outlet port 208. Frame portion 210 may be in contact with the inner surface of the housing 204 and is attached to portion 212. Frame portion 212 can be in contact with an output-facing surface of the second porous polymeric membrane 222. Such a composite membrane can provide benefits of both the polyol ligand and the polyphosphonic acid ligand, for metal removal, as understood from the disclosure.

In some embodiments, porous resin particles with the desired polyol ligand or polyphosphonic acid attached can be in the form of a packed bed and placed upstream of a retentive filter. The packed resin bed can be in the form of a mixed particle bed. For example, porous poly(styrene-co-divinylbenzene) resin particles with the desired amino polyol ligand can be mixed with porous poly(styrene-co-divinylbenzene) resin particles with the desired polyphosphonic acid attached and the mixture of resin particles can be placed in a packed resin bed upstream if a retentive filter. In some embodiments the downstream retentive filter can be a membrane that is surface modified, hydrophilic, or with a ligand attached. In some embodiments the retentive filter can be pleated, spiral wound, or layered and the porous resin particles can be packed into the flow path upstream of the retentive filter.

Figure 3:
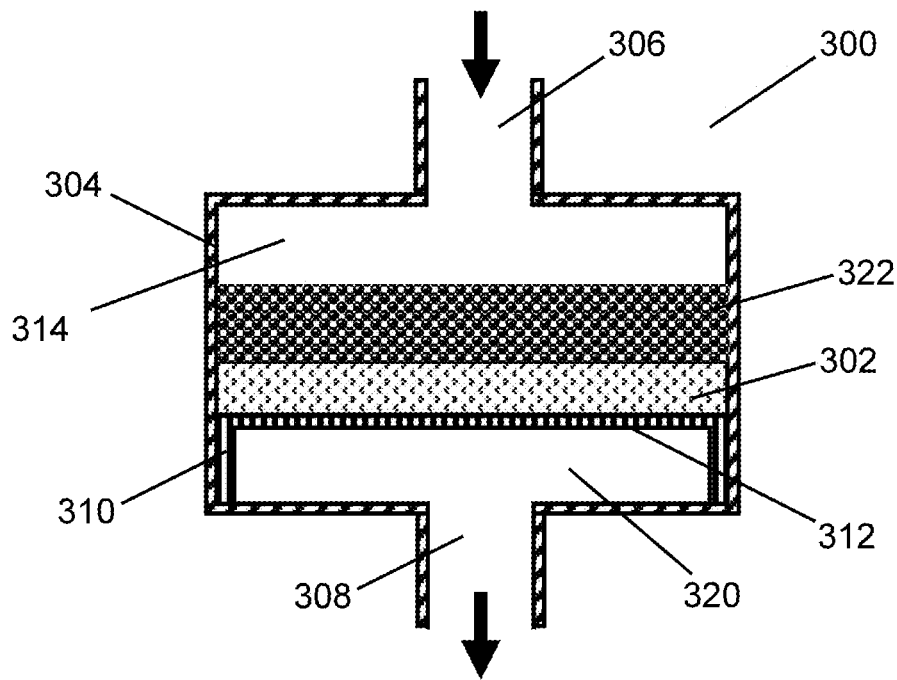
FIG. 3 is an illustration of an exemplary cross-section of a composite filter with a porous membrane having a first ligand, and a polymeric resin with a second ligand.

Another example of a filter with a composite membrane is shown in FIG. 3. Filter 300 includes a porous polymeric membrane 302 and fluidically proximal polymeric resin 322. The polymeric resin 322 can placed on the porous polymeric membrane 302 so resin particles are in direct contact with the input-facing surface of the membrane 302. The membrane 302/polymeric resin 322 have attached thereto the polyol ligand and the polyphosphonic acid ligand, respectively, or vice versa. The filter 300 can have a housing 304, inlet port 306, a headspace 314, a frame having frame portions 310 and 312, to support the membrane and polymeric resin during filtering, a backspace 320, and an outlet port 308. Frame portion 310 may be in contact with the inner surface of the housing 304 and is attached to portion 312. Frame portion 312 can be in contact with an output-facing surface of the second porous polymeric membrane 302. Such a composite membrane can provide benefits of both the polyol ligand, and the polyphosphonic acid ligand, for metal removal, as understood from the disclosure.

The filter of the disclosure as described can be useful for filtering a liquid to remove undesired metal-containing material (e.g., contaminants or impurities) from the liquid to produce a high purity liquid that can be used as a material of an industrial process. In particular, a porous polymeric filter membrane can be useful to remove a dissolved and/or suspended metal containing contaminant(s) from a liquid that is flowed through the membrane using a combination of a sieving mechanism and ligand binding of the metal ions. That is, larger metal-containing particles can be trapped by the filter by size restriction according to pore size, and metal ions which otherwise can travel through the pores, are captured by interaction with the polyol ligand, the polyphosphonic acid ligand, or a combination thereof, immobilized on the membrane.

The filter material(s) including the polyol ligand, the polyphosphonic acid ligand, or a combination thereof, can be used to remove metals and metal ions from fluids having levels of these materials that are too high for desired processes.

Exemplary metals that can be removed from the fluids using the ligand-modified filter materials of the disclosure include alkali metals which include the following chemical elements in group 1 of the periodic table: lithium (Li), sodium (Na), potassium (K), rubidium (Rb), and cesium (Cs). Other exemplary metals that can be removed from the fluids using the ligand-modified filter materials of the disclosure include alkaline earth metals which are the following chemical elements in group 2 of the periodic table: beryllium (Be), magnesium (Mg), calcium (Ca), strontium (Sr), barium (Ba), and radium (Ra). Other exemplary metals that can be removed from the fluids using the ligand-modified filter materials of the disclosure include transition metal which are elements in the d-block of the periodic table, which includes groups 3 to 12 on the periodic table, and include, but are not limited to transitions metals such as titanium (Ti), vanadium (V), chromium (Cr), manganese (Mn), iron (Fe), cobalt (Co), nickel (Ni), copper (Cu), zinc (Zn), yttrium (Y), zirconium (Zr), molybdenum (Mo), ruthenium (Ru), palladium (Pb), silver (Au), cadmium (Cd), tungsten (W), and mercury (Hg). Other exemplary metals that can be removed from the fluids using the ligand-modified filter materials of the disclosure include post transition metals (groups 13-15), which include aluminum (Al), gallium (Ga), indium (In), tin (Sn), thallium (Tl), lead (Pb), and bismuth (Bi).

Metal contaminant can refer to neutral, negatively charged, or positively charged metal species and combinations thereof which may be present at equilibrium. The metals can be in the liquid in the form of dissolved ions, suspended charged particles, colloids, or other aggregates, and any of these metal forms can be removed from the fluids using the ligand-modified filter materials of the disclosure include. Several metal ions, for example Fe and Al, can exist as oxides in water. These kinds of ions can form amphoteric colloidal particles or complexes. In basic conditions, such as base cleaning solution (SC1), some of the metal ions can exits as hydroxides, oxides, oxyhydroxides, and other anions, or any combination of these. In some fluids, metal ions may form species that are amphoteric and can include one or more of these groups and these can exist as either cationic or anionic complexes depending upon the conditions (pH, temperature, ionic strength) of the fluid.

Metal ionic impurities in a variety of fluids may be detected using ion chromatography. The removal of metal material from a fluid treated by the filters of the disclosure can be also determined using inductively coupled plasma mass spectrometry (ICP-MS).

A filter membrane of the present description can be useful with any type of industrial process that requires a high purity liquid material as an input. Non-limiting examples of such processes include processes of preparing microelectronic or semiconductor devices, processes of preparing pharmaceutical compositions, and diagnostic (e.g., medical diagnostic) compositions and methods. Methods and filters of the disclosure can be used in any of these areas.

A specific example is a method of filtering a liquid process material used for semiconductor photolithography. Examples of contaminants present in a process liquid or used for preparing microelectronic or semiconductor devices may include metal ions dissolved in the liquid, solid particulates suspended in the liquid, and gelled or coagulated materials (e.g., generated during photolithography) present in the liquid. In embodiments, the methods and filters of the disclosure are used to provide purified, low metal containing liquid compositions for front-end cleaning tools which are used to create the foundation for an integrated circuit. For example, the filters of the disclosure can be used to purify cleaning and etching agents, to minimize product contamination and improve process efficiencies (such as etch rate). In chemical-mechanical polishing processes, water is used in addition to reagents and abrasive particles.

In one mode of practice, the ligand-modified filters are used to remove metal and metal ion contaminants from an aqueous solution that includes one or more basic compounds. The type and amount of base can cause the composition to have a pH of about 10 or greater such as a pH in the range of 10-14, in the range of 11-14, or in the range of 12-14.

In an exemplary purification method, the filter is used to treat a liquid composition that includes a base such as tetramethyl ammonia hydroxide ($C_4H_{13}NO$, TMAH), tetrabutyl ammonium hydroxide ($C_{16}H_{37}NO$, TBAH), and ammonium hydroxide ($NH_4OH$). TMAH, TBAH, and $NH_4OH$ are useful reagents for removing photoresist in a semiconductor manufacturing process. TMAH and $NH_4OH$ are reagents that are commonly used to anisotropically etch silicon in semiconductor manufacturing. Concentrations of TMAH and $NH_4OH$ in the range of about 5% (wt) to about 30% (wt) are commonly used in etching processes. TMAH can also be used as a basic solvent (typically at concentrations of about 2.5% (wt)) for developing acidic photoresist for photolithography process. For use in semiconductor manufacturing, the TMAH or $NH_4OH$ compositions should have very high purity. Typically, resistivity in base-containing solutions should be greater than 18.18 MΩ·cm, and total metal concentrations should be preferably less than 0.01 μg/L, and most preferably less than 0.001 μg/L.

For example, in some modes of practice, an aqueous composition that includes TMAH or $NH_4OH$ is obtained, with a high concentration of the base, such as 20% (wt) or greater. The original (unfiltered) TMAH or $NH_4OH$ can be referred to as a "stock" or "starting" composition. The aqueous composition of TMAH or $NH_4OH$ has an amount of metal ion and/or metal containing impurities that are higher than desired for a target application, such as an etching solution for formation of an integrated circuit. For example, the metal impurities can be present in a total amount of greater than 0.001 μg/L (1000 parts per trillion (ppt)), greater than 0.005 μg/L (5000 ppt), greater than 0.01 μg/L (10,000 ppt). or greater than 0.05 μg/L (50,000 ppt) in the starting base composition. The starting TMAH or $NH_4OH$ is then passed through the filter that includes the polyol ligand, the polyphosphonic acid ligand, or a combination thereof, to remove metal contaminants and to provide a filtered aqueous composition that includes TMAH or $NH_4OH$ but has an amount of metals that is lower than the amount of metals in the starting composition. In modes of practice the filter of the disclosure can remove an amount of about 25% (wt) or greater, about 30% (wt) or greater, about 35% (wt) or greater, about 40% (wt) or greater, about 45% (wt) or greater, about 50% (wt) or greater, about 55% (wt) or greater, about 60% (wt) or greater, about 65% (wt) or greater, about 70% (wt) or greater, about 75% (wt) or greater, about 80% (wt) or greater, about 85% (wt) or greater, about 90% (wt) or greater, or about 95% (wt) or greater, any one or more metals from the starting composition.

In another mode of practice, the ligand modified filters are used to remove metal and metal ion contaminants from an aqueous solution that includes one or more acidic compounds. The type and amount of base can cause the composition to have a pH of about 3 or lower, or about 2 or lower.

In an exemplary purification method, the filter is used to treat a liquid composition that includes an acid such as comprises hydrochloric acid (HCl), sulfuric acid ($H_2SO_4$), phosphoric acid ($H_3PO_4$,) nitric acid ($HNO_3$), and hydrofluoric acid (HF). Strong acids such as HCl are reagents that are commonly used to isotropically etch materials such as aluminum, indium tin oxide (ITO), chromium, organic residues and photoresist, silicon, silicon dioxide, silicon nitride, and titanium in semiconductor manufacturing. Concentrations of the acid can be in the range of about 1% (wt) (dilute) to fully concentrated (such as greater than 10% or more) for an etching process. For use in semiconductor manufacturing, the acidic solution should have very high purity. Typically, resistivity in such acidic etching solutions should be greater than 18.18 MΩ·cm, and total metal concentrations should be preferably less than 0.01 μg/L, and most preferably less than 0.001 μg/L.

For example, in some modes of practice, an aqueous composition that includes one or more of HCl, $H_2SO_4$, $H_3PO_4$, $HNO_3$, and HF is obtained, with an amount of acid that provides a dilute or concentrated acid solution, or any concentration in between. The original (unfiltered) acid-containing composition can be referred to as a "stock" or "starting" acid composition. The aqueous acid composition can have an amount of metal ion and/or metal containing impurities that are higher than desired for a target application, such as a wet etching solution for formation of an integrated circuit. For example, the metal impurities can be present in a total amount of greater than 0.001 μg/L (1000 parts per trillion (ppt)), greater than 0.005 μg/L (5000 ppt), greater than 0.01 μg/L (10,000 ppt). or greater than 0.05 μg/L (50,000 ppt) in the starting acid composition. The starting acid composition is then passed through the filter that includes the polyol ligand, the polyphosphonic acid ligand, or a combination thereof, to remove metal contaminants and to provide a filtered aqueous composition that includes the acid(s) but has an amount of metals that is lower than the amount of metals in the starting composition. In modes of practice the filter of the disclosure can remove an amount of about 25% (wt) or greater, about 30% (wt) or greater, about 35% (wt) or greater, about 40% (wt) or greater, about 45% (wt) or greater, about 50% (wt) or greater, about 55% (wt) or greater, about 60% (wt) or greater, about 65% (wt) or greater, about 70% (wt) or greater, about 75% (wt) or greater, about 80% (wt) or greater, about 85% (wt) or greater, about 90% (wt) or greater, or about 95% (wt) or greater, any one or more metals from the starting acid composition.

In another mode of practice, the ligand modified filters are used to remove metal and metal ion contaminants from an organic solvent. Some specific, non-limiting, examples of solvents that can be filtered using a filter membrane as described include: n-butyl acetate (nBA), isopropyl alcohol (IPA), 2-ethoxyethyl acetate (2EEA), a xylene, cyclohexanone, ethyl lactate, methyl isobutyl carbinol (MIBC), methyl isobutyl ketone (MIBK), isoamyl acetate, undecane, propylene glycol methyl ether (PGME), and propylene glycol monomethyl ether acetate (PGMEA).

For example, in some modes of practice, a solvent is obtained having an amount of metal ion and/or metal containing impurities that are higher than desired for a target application, such as cleaning solvents, or solvents for resist stripping applications in lithography, for formation of an integrated circuit. For example, the metal impurities can be present in a total amount of greater than 0.001 μg/L (1000 parts per trillion (ppt)), greater than 0.005 μg/L (5000 ppt), greater than 0.01 μg/L (10,000 ppt). or greater than 0.05 μg/L (50,000 ppt) in the solvent. The solvent is then passed through the filter that includes the polyol ligand, the polyphosphonic acid ligand, or a combination thereof, to remove metal contaminants and to provide a filtered solvent having an amount of metals that is lower than the amount of metals in the starting solvent. In modes of practice the filter of the disclosure can remove an amount of about 25% (wt) or greater, about 30% (wt) or greater, about 35% (wt) or greater, about 40% (wt) or greater, about 45% (wt) or greater, about 50% (wt) or greater, about 55% (wt) or greater, about 60% (wt) or greater, about 65% (wt) or greater, about 70% (wt) or greater, about 75% (wt) or greater, about 80% (wt) or greater, about 85% (wt) or greater, about 90% (wt) or greater, or about 95% (wt) or greater, any one or more metals from the starting solvent.

The acid or base solutions, or solvent, that are treated to remove metal contaminants can be passed through the filters under desired conditions, such as those that enhance removal of metal contaminant from the fluid stream. In some modes of practice, the acid or base solution, or solvent, is passed through the filter at a temperature of about 160° C. or less, 120° C. or less, or 80° C. or less.

The passage of acid- or base-containing liquid, or solvent, through the porous membrane that includes polyol ligand, the polyphosphonic acid ligand, or a combination thereof is not limited to any particular flow rate provided an essentially flux-independent metal impurity removal is achieved and a useful pressure drop for the application is provided. The area of the porous membrane used can be chosen to provide a device with an acceptable pressure drop and essentially flux independent ligand binding for the flow rate and process requirements of the application. In various embodiments, the membrane area can be about 0.25 cm$^2$ or greater, and the specified or fixed area used to determine pressure drop for each membrane to meet the requirements of the application.

In some modes of practice, filters including porous membrane of the disclosure can remove particulates, metal-containing or other, from the fluid stream. Particle retention can be evaluated by measuring the number of test particles removed from a fluid stream by a membrane placed in the fluid stream. By one method, particle retention can be measured by passing a sufficient amount of an aqueous feed solution of 0.1% Triton X-100, containing 8 ppm polystyrene particles (0.025 μm Green Fluorescent Polymer Microspheres, Fluoro-Max (available from ThermoFisher SCIENTIFIC)), to achieve 0.5, 1, and 2% monolayer coverage through the membrane at a constant flow of 7 milliliters per minute, and collecting the permeate. The concentration of the polystyrene particles in the permeate can be calculated from the absorbance of the permeate. Particle retention is then calculated using the following equation:

$$\text{particle retention} = \frac{[\text{feed}] - [\text{filtrate}]}{[\text{feed}]} \times 100\%.$$

In addition, a filter membrane as described can be characterized by a flow rate or flux of a flow of liquid through the filter membrane. The flow rate must be sufficiently high to allow the filter membrane to be efficient and effective for filtering a flow of fluid through the filter membrane. A flow rate, or as alternately considered, a resistance to a flow of liquid through a filter membrane, can be measured in terms of flow rate or flow time (which is an inverse to flow rate). A filter membrane as described herein including the amino polyol ligand and/or polyphosphonic acid ligand, can preferably have a relatively low flow time, preferably in combination with a bubble point that is relatively high, and good filtering performance (e.g., as measured by particle retention). An example of a useful or preferred flow time can be below about 8,000 seconds/500 mL, e.g., below about 4,000/500 mL, below about 2,000 seconds/500 mL, below about 1,000 seconds/500 mL, below about 500 seconds/500 mL, or below about 200 seconds/500 mL.

Membrane water flow time can be determined by cutting membranes into 47 mm disks and wetting with water before placing the disk in a filter holder attached to a reservoir for holding a volume of water. The reservoir is connected to a pressure regulator. Water is flowed through the membrane under 14.2 psi (pounds per square inch) differential pressure. After equilibrium is achieved, the time for 500 mL of water to flow through the membrane is recorded.

In embodiments, the filter of the disclosure is used in a system for manufacturing a semiconductor article. FIG. 4 shows components of a semiconductor fabrication system 400 that includes a chamber 402 in which a microelectronic component, such as an integrated circuit, is fabricated. The chamber 402 is able to receive basic solution, such as a TMAH or NH$_4$OH solution, or an acid solution such as HCl, H$_2$SO$_4$, H$_3$PO$_4$, HNO$_3$, and HF, for cleaning, wet etching, or processing photoresist, etc. The basic solution can be provided from a basic solution supply source 412, which can be any container, configured to hold the basic solution. Likewise, the acidic solution can be provided from an acidic solution supply source 422, which can be any container, configured to hold the acidic solution. Fluid movement of the basic solution through basic solution conduit 416 and acidic solution through acidic solution conduit 426 can be affected by pumps 414 and 424, respectively. Valve 430 is in fluidic communication with conduits 416 and 426 and can regulate flow of the basic and acidic solutions into the filter 435, and subsequently into the chamber 402 through conduit 438. The filter 435 can include a filter material having the polyol ligand, the polyphosphonic acid ligand, or both types of ligands. In an exemplary mode of operation, an acidic solution flows through filter 435 to reduce amounts of metal-containing impurities, and the filtered acidic solution is then used in a processing step, such as a wet etching step. In another exemplary mode of operation, a basic solution flows through filter 435 to reduce amounts of metal-containing impurities, and the filtered basic solution is then used in a processing step, such for removal of a photoresist.

FIG. 5 shows another embodiment of a semiconductor fabrication system 500 that includes a chamber 502, basic solution supply source 512, acidic solution supply source 522, basic solution conduit 516, acidic solution conduit 526, and pumps 514 and 524, respectively. In this arrangement, two filters are used, a first filter 535 in fluidic communication with the basic solution supply source 512, and a second filter 545 in fluidic communication with the acidic solution supply source 522. The first filter 535 can be a filter having either the polyol ligand, or the polyphosphonic acid ligand. The second filter 545 can be a filter having either the amino polyol ligand, or the polyphosphonic acid ligand. Valve 530 is in fluidic communication with filters 535 and 545 and can regulate flow of the basic and acidic solutions from the filters and subsequently into the chamber 502. In an exemplary mode of operation, an acidic solution flows through filter 545 to reduce amounts of metal-containing impurities, and the filtered acidic solution is then used in a processing step, such as a wet etching step. In another exemplary mode of operation, a basic solution flows through filter 535 to reduce amounts of metal-containing impurities, and the filtered basic solution is then used in a processing step, such for removal of a photoresist.

EXAMPLES

Example 1

Cleaning of Porous Polymeric Resins

The following example demonstrates a method used to clean porous polymeric resins for use in removal of trace metals.

First, 10 g of each porous polymeric resin was weighed out and placed into a clean 1 liter PTFE bottle (Savillex). The resins were wetted with 200 mL IPA (Isopropanol Gigabit ®, KMG) and gently agitated for 1 hour. After an hour the resins were allowed to settle, and the IPA was decanted. Next, the resins were exposed to 500 mL of a mixture of 70% IPA/10% HCl (Hydrochloric Acid 37% Gigabit®, KMG) and gently agitated for 1 hour. After an hour the resins were allowed to settle, and the 70% IPA/10% HCl was decanted. Next, the resins were exposed to an additional 500 mL of 70% IPA/10% HCl and gently agitated for 16 hours. After 16 hours the resins were allowed to settle, and the 70% IPA/10% HCl was decanted. Next, the resins were washed and exchanged into de-ionized water (DIW) several times, and the DIW was decanted. Next, the resins were exchanged into 500 mL of 2% $NH_4OH$ (Ammonium Hydroxide 29% Cleanroom® MB, KMG) and gently agitated for 1 hour. Finally, the resins were exchanged several times with DIW followed by IPA and placed in a convection oven at 70° C. till dry. The cleaned resins were placed in a clean PTFE jar till used.

Example 2

Measurement of Metal Reduction in TMAH by Porous Polymeric Resins Containing Chelating Ligands Using Static Soaking Experiments The following example demonstrates a method used to measure the ability of porous polymeric resins to reduce metal concentration in 2.38% TMAH under conditions of static soaking. The results demonstrate that resins with N-methyl glucamine and diphosphonic acid ligands are effective at removing target metals (Na, Al, K, Ca, Ti, Cr, Mn, Fe, and Zn) by 67.2 and 76.7% total metal removal respectively.

Resins were cleaned using a method similar to Example 1. TMAH metal solution was prepared by spiking 2.38% TMAH (NMD-3, TOKYO OHKA KOGYO AMERICA, INC.) with a target metal concentration of 5000 ppt of each of the following metals Na, Al, K, Ca, Ti, Cr, Mn, Fe, and Zn (PlasmaCAL Single Element Calibration Standards, SCP SCIENCE). Next, 0.2 g of each dried resin was measured out and placed in a clean 25 mL PTFE jar (Savillex). Next, 20 mL of the 2.38% TMAH metal spiked solution was added to the PTFE jar containing the cleaned resins. The jars were capped and rotated for 16 hours. After 16 hours the resins were allowed to settle, and the liquid was decanted into vials for analysis. The metal concentration for each liquid sample was measured by ICP-MS. This experiment evaluated two resins with different chelating ligands and a control resin with no ligand attached. This example demonstrates that identified chelating resins, N-methyl glucamine resin (Purolite ® S108, Purolite) and Diphosphonic acid resin (Diphonix, Eichrom Technologies) were surprisingly more effective at reducing metals from 2.38% TMAH in comparison to a resin with no ligand (StratoSpheres™ PL-PS/DVB resin). Results are shown in Table 1.

TABLE 1

Metal reduction in 2.38% TMAH using static soaking experiments

| Metal | Resin with no ligand | N-methyl glucamine resin | Diphosphonic acid resin |
|---|---|---|---|
| | Metal Reduction (%) | | |
| Na | 0.0 | 11.2 | 80.5 |
| K | 0.0 | 81.2 | 78.7 |
| Al | 0.7 | 15.4 | 0.0 |
| Ca | 46.0 | 97.7 | 100.0 |
| Ti | 0.8 | 99.5 | 81.8 |
| Cr | 0.1 | 93.9 | 51.8 |
| Mn | 1.5 | 99.5 | 99.7 |
| Fe | 0.4 | 97.7 | 97.6 |
| Zn | 3.3 | 9.1 | 100.0 |
| Total Metals | 5.9 | 67.2 | 76.7 |

Based on these results, a porous polymeric filter membrane comprising this ligand would produce a filter material that could be configured for providing a metal ion-depleted liquid composition comprising TMAH used in a microelectronic fabrication system.

Example 3

Measurement of Metal Reduction in TMAH by Porous Polymeric Resins Containing Chelating Ligands Using Dynamic Flow-through Experiments The following example demonstrates a method used to measure the ability of porous polymeric resins to reduce metal concentration in 2.38% TMAH under conditions of dynamic flow.

Resins were cleaned using a method similar to Example 1. Next, a TMAH metal solution was prepared using a method similar to Example 2. Next, each resin was flow packed into a 1 mL column prepared from pre-cleaned PTFE tubing and polyethylene frits. Next, the resin packed column was equilibrated with metal free TMAH. After equilibration, the resin packed column was loaded with the TMAH metal solution using residence time of 6 minutes and the column effluent was fractionated at 30, 45, 60, and 75 column volumes (CV). The metal concentration for each liquid sample was measured by ICP-MS. Results are shown in FIG. 6. The results demonstrate that resins with N-methyl glucamine are surprisingly effective at removing target metals in comparison to a resin with no ligand when exposed to 2.38% TMAH under dynamic conditions. Based on these results, a porous polymeric filter membrane comprising this ligand would produce a filter material that could be configured for providing a metal ion-depleted liquid composition comprising TMAH used in a microelectronic fabrication system.

Example 4

Measurement of Metal Reduction in 35% HCl by Porous Polymeric Resins Containing Chelating Ligands Using Static Soaking Experiments The following example demonstrates a method used to measure the ability of porous polymeric resins to reduce metal concentration in 35% HCl under conditions of static soaking. The results demonstrate that a resin with N-methyl glucamine ligand is effective at removing target metals, Ti and Fe, by 100% in 35% HCl.

Resins were cleaned using a method similar to Example 1. Next, a 35% HCl metal solution was prepared by spiking 35% HCl (Hydrochloric Acid 37% Gigabit®, KMG) with a target metal concentration of 5000 ppt of each, Fe and Ti (PlasmaCAL Single Element Calibration Standards, SCP SCIENCE). Next, 0.2 g of each dried resin was measured out and placed in a clean 25 mL PTFE jar (Savillex). Next, 20 mL of the 35% HCl metal spiked solution was added to the PTFE jar containing the cleaned resins. The jars were capped and rotated for 16 hours. After 16 hours the resins were allowed to settle, and the liquid was decanted into vials for analysis. The metal concentration for each liquid sample was measured by ICP-MS. The resin with N-methyl glucamine ligand surprisingly demonstrated complete target metal removal indicating high metal removal efficiency. Other purification resins, such as a resin with no ligand (StratoSpheres™ PL-PS/DVB resin), a strong acid cation exchange resin (DOWEX™ MARATHON™ MSC, The Dow Chemical Company), and a quaternary ammonium anion exchange resin (AMBERSEP 900, The Dow Chemical Company) only removed 2.7, 27.4, and 34.8% of total target metals respectively. Results are shown in Table 2.

TABLE 2

Metal reduction in 35% HCl using static soaking experiments

| Metal | Resin with no ligand | Strong acid cation exchange resin | Quaternary ammonium anion exchange resin | N-methyl glucamine resin |
|---|---|---|---|---|
| | | Metal Reduction (%) | | |
| Fe | 4.2 | 55.8 | 0.0 | 100 |
| Ti | 1.5 | 3.0 | 64.6 | 100 |
| Total | 2.7 | 27.4 | 34.8 | 100 |

Based on these results, a porous polymeric filter membrane comprising this ligand would produce a filter material that could be configured for providing a metal ion-depleted liquid composition comprising concentrated HCl used in a microelectronic fabrication system.

Example 5

Measurement of Metal Reduction in 35% HCl by Porous Polymeric Resins Containing Chelating Ligands Using Dynamic Flow-through Experiments The following example demonstrates a method used to measure the ability of porous polymeric resins containing N-methyl glucamine ligands to reduce metal concentration in 35% HCl under conditions of dynamic flow.

Resins were cleaned using a method similar to Example 1. Next, a 35% HCl metal solution was prepared by spiking 35% HCl using a method similar to Example 4. Next, each resin was flow packed into a 1 mL column prepared from PTFE tubing and polyethylene frits. Next, the resin packed column was equilibrated with metal free 35% HCl. After equilibration, the resin packed column was loaded with the 35% HCl metal solution using residence time of 6 minutes and the column effluent was fractionated at 30, 45, 60, and 75 column volumes (CV). Results are shown in FIG. 7. This example demonstrates that the identified chelating resin with N-methyl glucamine ligand (Purolite® S108, Purolite), removes over 90% of target metals Fe and Ti through a loading of 60 CV. Since a control resin with no ligand (StratoSpheres™ PL-PS/DVB resin) does not demonstrate significant target metal reduction it is assumed that the ligand, N-methyl glucamine, is responsible for the surprisingly efficient metal reduction in 35% HCl under conditions of dynamic flow. Based on these results, a porous polymeric filter membrane comprising this ligand would produce a filter material that could be configured for providing a metal ion-depleted liquid composition comprising concentrated HCl used in a microelectronic fabrication system.

Example 6

Measurement of Metal Reduction in 3.5% HCl by Porous Polymeric Resins Containing Chelating Ligands Using Static Soaking Experiments The following example demonstrates a method used to measure the ability of porous polymeric resins to reduce metal concentration in 3.5% HCl under conditions of static soaking. The results demonstrate that resins with diphosphonic acid are effective at removing target metals, Ti and Fe from 3.5% HCl.

Resins were cleaned using a method similar to Example 1. Next, a 3.5% HCl metal solution was prepared by spiking 3.5% HCl (Hydrochloric Acid 37% Gigabit®, KMG) with a target metal concentration of 5000 ppt of each Fe and Ti (PlasmaCAL Single Element Calibration Standards, SCP SCIENCE). Next, 0.2 g of each dried resin was measured out and placed in a clean 25 mL PTFE jar (Savillex). Next, 20 mL of the 3.5% HCl metal spiked solution was added to the PTFE jar containing the cleaned resins. The jars were capped and rotated for 16 hours. After 16 hours the resins were allowed to settle, and the liquid was decanted into vials for analysis. The metal concentration for each liquid sample was measured by ICP-MS. The resin evaluated in this experiment, diphosphonic acid resin (Diphonix, Eichrom Technologies), removed over 99% of target metals, Ti and Fe, from 3.5% HCl. Since a control resin with no ligand does not demonstrate significant target metal reduction, it is assumed that the ligand, diphosphonic acid, is responsible for the efficient metal reduction in 3.5% HCl. Results are shown in Table 3.

TABLE 3

Metal reduction in 3.5% HCl using static soaking experiments

| Metal | Resin with no ligand | Diphosphonic acid resin |
|---|---|---|
| | Metal Reduction (%) | |
| Fe | 4.0 | 100.0 |
| Ti | 0.0 | 99.0 |
| Total | 2.0 | 99.5 |

Based on these results, a porous polymeric filter membrane comprising this ligand would produce a filter material that could be configured for providing a metal ion-depleted liquid composition comprising dilute HCL used in a microelectronic fabrication system.

Example 7

Measurement of Metal Reduction in 14% NH$_4$OH by Porous Polymeric Resins Containing Chelating Ligands Using Dynamic Flow-through Experiments The following example demonstrates a method used to measure the ability of porous polymeric resins containing diphosphonic acid and N-methyl glucamine ligands to reduce metal concentration in 14% NH$_4$OH under conditions of dynamic flow.

Figure 8:
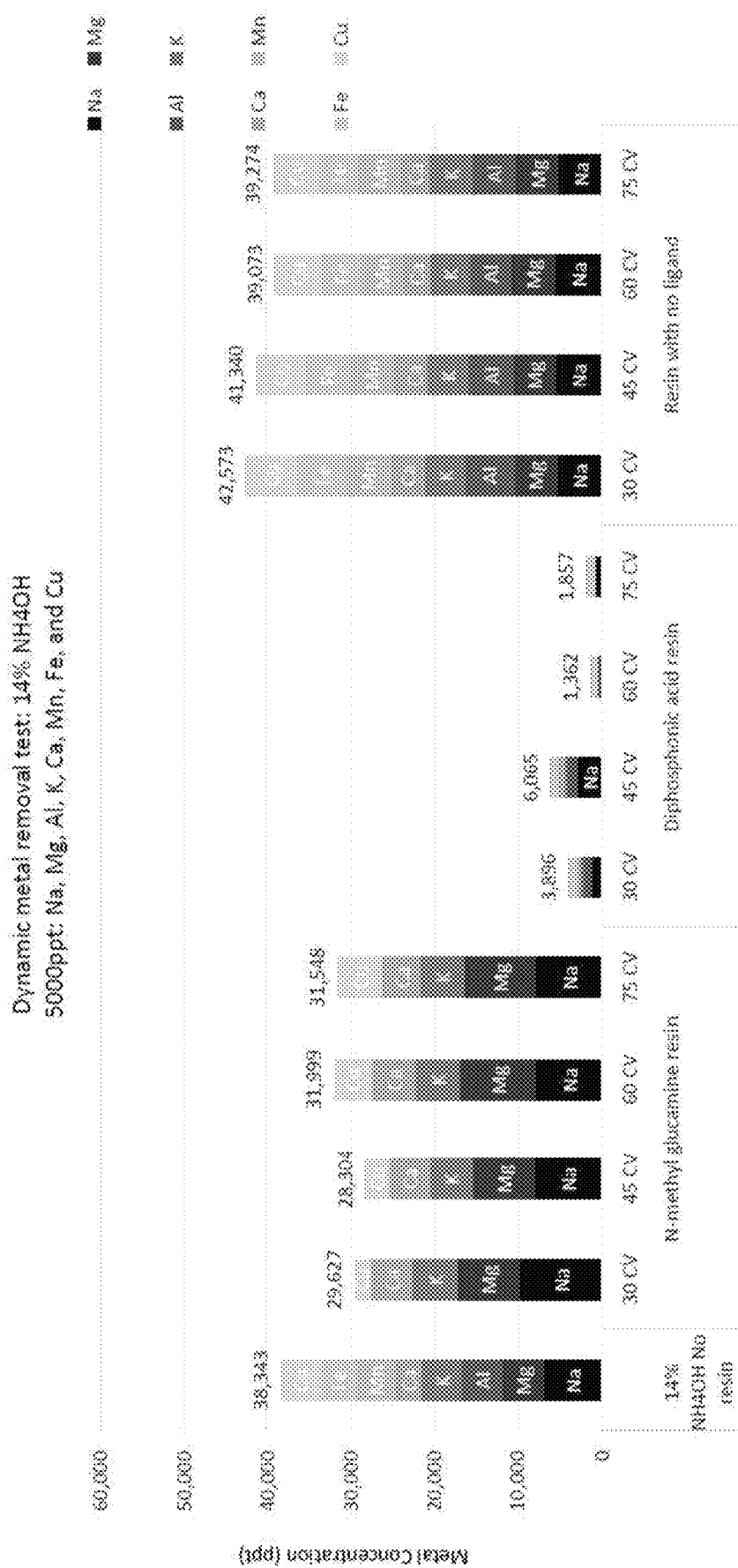
FIG. 8 is a graph showing reduction of metal from an ammonium hydroxide ($NH_4OH$) solution using N-methylglucamine-modified and diphosphonic acid-modified porous polymeric resins, and resins without any ligand.

Resins were cleaned using a method similar to Example 1. Next, a 14% NH$_4$OH metal solution was prepared by spiking 14% NH$_4$OH with 5000 ppt of each metal Na, Mg, Al, K, Ca, Mn, Fe, and Cu. Next, each resin was flow packed into a 1 mL column prepared from PTFE tubing and polyethylene frits. Next, the resin packed column was equilibrated with metal free 14% NH$_4$OH. After equilibration, the resin packed column was loaded with the 14% NH$_4$OH metal solution using residence time of 6 minutes and the column effluent was fractionated at 30, 45, 60, and 75 column volumes (CV). Results are shown in FIG. 8. This example demonstrates that the identified chelating resin with diphosphonic acid ligand (Diphonix, Eichrom Technologies), removes over 90% of target metals through a loading of 75 CV. Since a control resin with no ligand (Strato-Spheres™ PL-PS/DVB resin) does not demonstrate significant target metal reduction it is assumed that the ligand, diphosphonic acid, is responsible for the surprisingly efficient metal reduction in 14% NH$_4$OH under conditions of dynamic flow. It is also notable that the resin with N-methylglucamine ligand (Purolite® S108, Purolite) efficiently removes Al from 14% NH$_4$OH. Based on these results, a porous polymeric filter membrane comprising these ligands would produce a filter material that could be configured for providing a metal ion-depleted liquid composition comprising ammonium hydroxide used in a microelectronic fabrication system.

Example 8

Measurement of Metal Reduction in OK73 Thinner by Porous Polymeric Resins Containing Chelating Ligands Using Dynamic Flow-through Experiments The following example demonstrates a method used to measure the ability of porous polymeric resins containing diphosphonic acid ligands to reduce metal concentration in OK73 (PGME/PGMEA) under conditions of dynamic flow.

Figure 9:
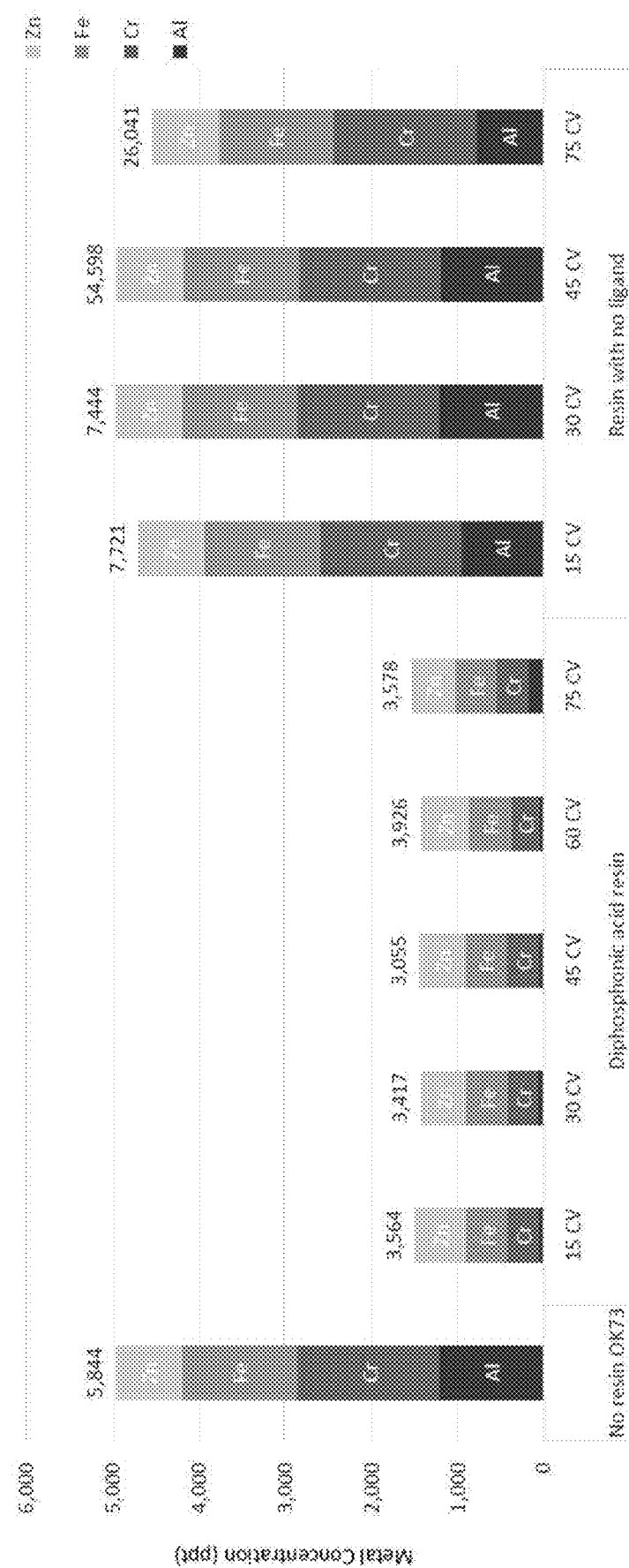
FIG. 9 is a graph showing reduction of metal from an organic solvent (propylene glycol monomethyl ether (acetate)) solution using diphosphonic acid-modified porous polymeric resins, and resins without any ligand.

Resins were cleaned using a method similar to Example 1. Next, an OK73 metal solution was prepared by spiking OK73 Thinner (TOKYO OHKA KOGYO AMERICA, INC.) with about 1000 ppt of each Zn, Fe, Cr, and Al (CONOSTAN Oil Analysis Standard, SCP SCIENCE). Next, each resin was flow packed into a 1 mL column prepared from PTFE tubing and polyethylene frits. Next, the resin packed column was equilibrated with metal free OK73 Thinner. After equilibration, the resin packed column was loaded with the OK73 Thinner metal solution using residence time of 6 minutes and the column effluent was fractionated at 30, 45, 60, and 75 column volumes (CV). Results are shown in FIG. 9. This example demonstrates that the identified chelating resin with diphosphonic acid resin (Diphonix, Eichrom Technologies), removes over 70% of combined target metals through loading of 75 CV. Since a control resin with no ligand does not demonstrate significant target metal reduction it is assumed that the ligand is responsible for the surprisingly efficient metal reduction in OK73 Thinner under conditions of dynamic flow. Based on these results, a porous polymeric filter membrane comprising this ligand would produce a filter material that could be configured for providing a metal ion-depleted liquid composition comprising OK73 Thinner used in a microelectronic fabrication system.

Example 9

0.2 μm and 0.05 um UPE Membranes Surface Modified with Poly(Vinylbenzylchloride/N-Methyl-D-glucamine)

This example demonstrates surface modification of 0.2 μm and 0.05 um ultra high molecular weight polyethylene (UPE) membranes with Poly(Vinylbenzylchloride/N-Methyl-D-glucamine) P(VBC/NMDG).

A solution of 4% by weight P(VBC/NMDG) was prepared by reacting Poly(Vinylbenzyl chloride) (PVBC) with N-Methyl-D-glucamine (NMDG) in a solvent mixture of Dimethylformamide (DMF) and de-ionized water (DIW) according to Table 4.

TABLE 4

P(VBC/NMDG) Reaction Parameters and Concentrations

| DMF (g) | DIW (g) | PVBC (g) | NMDG (g) | Temperature (Celsius) | Time (Hr) |
|---|---|---|---|---|---|
| 7920 | 720 | 220 | 140 | 40 | 24 |

After 24 hours at 40° C. the solution containing the P(VBC/NMDG) was allowed to cool to room temperature and was vacuum filtered through a 1.0 μm polyethylene vacuum filter.

Both 0.2 μm and 0.05 um P(VBC/NMDG) modified UPE membrane were prepared through surface modification using the filtered solution from Table 4. The surface modification was achieved by wetting UPE membrane with 4% P(VBC/NMDG) mixture. After the membranes were imbibed with 4% P(VBC/NMDG) mixture, the excess liquid was removed by pressing the membrane between two sheets of polyethylene film. The resulting UPE membranes coated P(VBC/NMDG) polymer were removed from the polyethylene film, placed in a restraining holder, and annealed in a convection oven at 65° C. oven for 10 minutes.

Example 10

Measurement of Metal Reduction in 10% TBAH by N-Methyl-D-Glucamine Modified UPE Membrane Using Dynamic Flow Experiments The following example demonstrates a method used to measure the ability of N-Methyl-D-glucamine modified UPE membrane to reduce metal concentration in 10% Tetrabutylammonium hydroxide (TBAH) under dynamic flow conditions. The results demonstrate that UPE membranes modified with N-Methyl-D-glucamine are effective at removing target metals, Al, Cr, Fe, Mn, and Ti in 10% TBAH.

Figure 10:
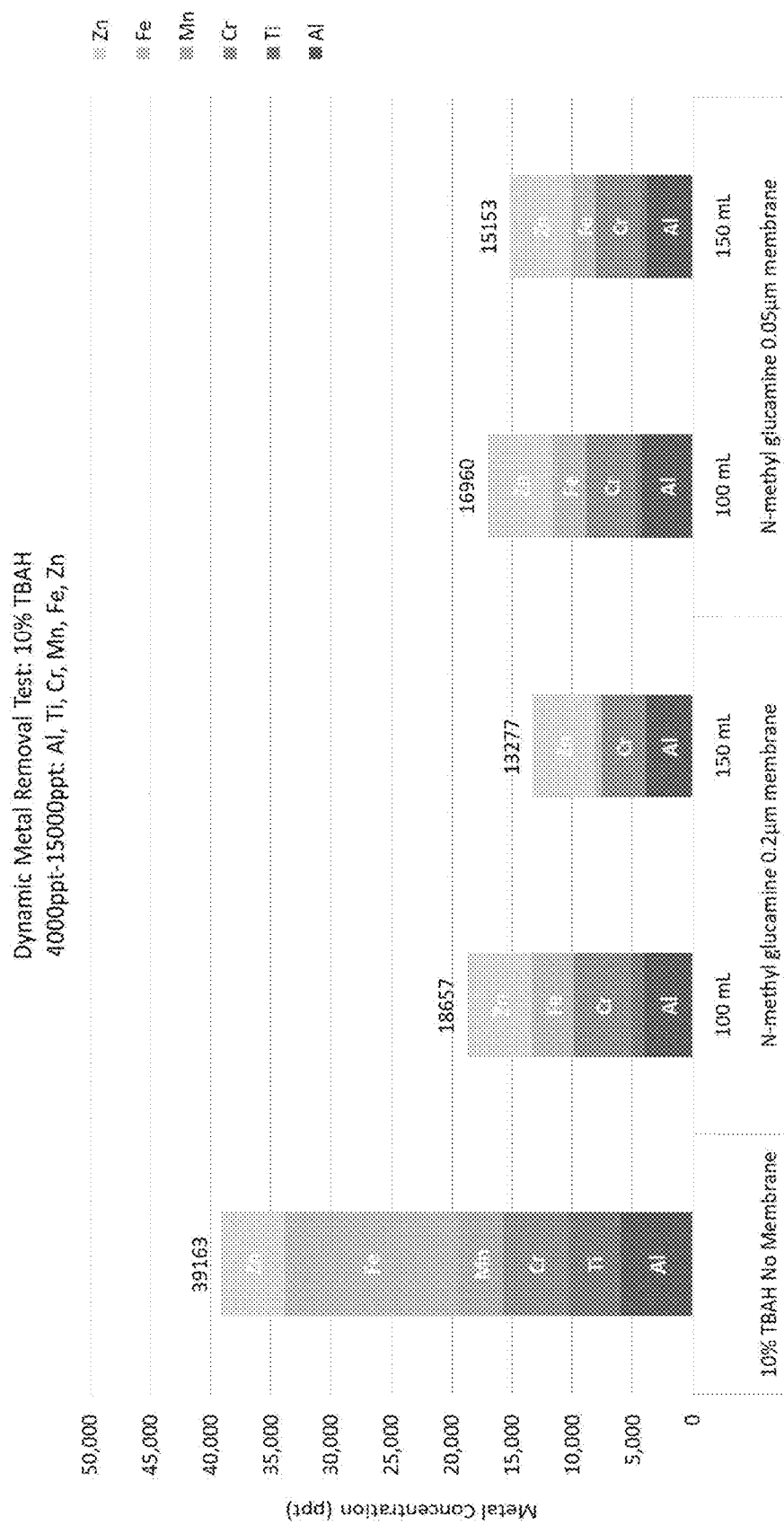
FIG. 10 is a graph showing reduction of metal from a tetrabutyl ammonium hydroxide (TBAH) solution using a N-methylglucamine-modified porous polymeric membrane.

N-Methyl-D-glucamine modified UPE membranes were prepare using a method similar to Example 9 and were cleaned using a method similar to Example 1. Next, a 10% TBAH metal solution was prepared by spiking (Tetrabutylammonium Hydroxide, 55% (Aqueous Solution), SACHEM) with a target concentration 2000ppt of each, Al, Ca, Fe, Mn, Ti and Zn (PlasmaCAL Single Element Calibration Standards, SCP SCIENCE) as an addition to metals that were already present in solution. Next, the N-Methyl-D-glucamine modified UPE membrane coupons were secured into a clean 47 mm Filter Assembly (Savillex). The membrane and filter assembly were flushed with 100 mL Isopropanol Gigabit (KMG) followed by 300 mL 3.5% HCl (Hydrochloric Acid 37% Gigabit®, KMG) and then 300 mL deionized water. Next, the spiked 10% TBAH solution was passed through the filter assembly containing the cleaned N-Methyl-D-glucamine modified UPE membrane and the filtrate was collected at 50 mL intervals into PTFE vials (Savillex) for analysis. The metal concentration for each liquid sample was measured by ICP-MS. The N-Methyl-D-glucamine modified UPE membranes evaluated in this experiment, removed over 97% of target metals, Fe, Mn, Ti, and about 35% of target metals, Al and Cr, from 10% TBAH. Since unmodified UPE membrane is known to be ineffective for removing metal in 10% TBAH it can be concluded that the N-Methyl-D-glucamine modification is responsible for the efficient metal reduction in 10% TBAH. Results are shown in FIG. 10.

Example 11

Measurement of Metal Reduction in 2.38% TMAH by N-Methyl-D-Glucamine Modified UPE Membrane Using Dynamic Flow Experiments The following example demonstrates a method used to measure the ability of N-Methyl-D-glucamine modified UPE membrane to reduce metal concentration in 2.38% Tetramethylammonium Hydroxide under dynamic flow conditions. The results demonstrate that UPE membranes modified with N-Methyl-D-glucamine are effective at removing target metals, Fe, Cr, Cu, Mg, Mn, and Ni in 2.38% TMAH.

Figure 11:
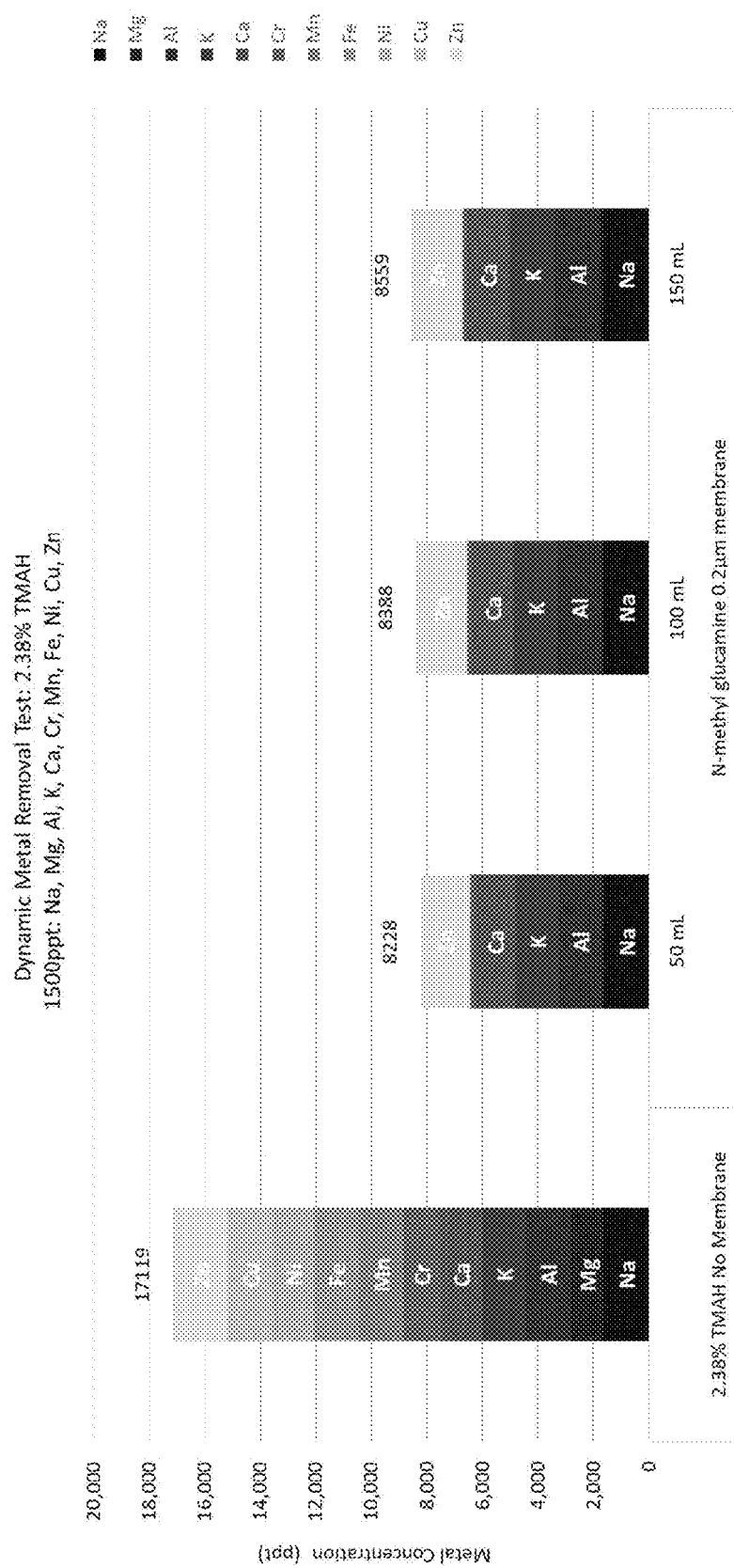
FIG. 11 is a graph showing reduction of metal from a methyl ammonium hydroxide (TMAH) solution using a N-methylglucamine-modified porous polymeric membrane.

N-Methyl-D-glucamine modified UPE membranes were prepare using a method similar to Example 9 and were cleaned using a method similar to Example 1. Next, a 2.38% metal solution was prepared by spiking (NMD-3 Tetramethylammonium Hydroxide, 2.38% (Aqueous Solution) TOK) with a target concentration 1500ppt of each Al, Ca, Cr, Cu, Fe, K, Mg, Mn, Na, Ni, and Zn (PlasmaCAL Single Element Calibration Standards, SCP SCIENCE). Next, the N-Methyl-D-glucamine modified UPE membrane coupons were secured into a clean 47 mm Filter Assembly (Savillex). The membrane and filter assembly were flushed with 100 mL Isopropanol Gigabit (KMG) followed by 300 mL 3.5% HCl (Hydrochloric Acid 37% Gigabit®, KMG) and then 300 mL deionized. Next, the spiked 2.38% TMAH solution was passed through the filter assembly containing the cleaned N-Methyl-D-glucamine modified UPE membranes and the filtrate was collected at 50 mL intervals into PTFE vials (Savillex) for analysis. The metal concentration for each liquid sample was measured by ICP-MS. The N-Methyl-D-glucamine modified UPE membranes evaluated in this experiment, removed almost all of target metals, Cr, Cu, Fe, Mg, Mn, and Ni from the 2.38% TMAH solution. Since unmodified UPE membrane is known to be ineffective for removing metal in 2.38% TMAH it can be concluded that the N-Methyl-D-glucamine modification is responsible for the efficient metal reduction in 2.38% TMAH. Results are shown in FIG. 11.

In a first aspect a filter material comprises (a) a polyol ligand comprising three or more hydroxyl groups, (b) a polyphosphonic acid ligand, or both (a) and (b), wherein the filter material is configured to be used in conjunction with a microelectronic fabrication system, for providing a metal- or metal ion-depleted liquid composition.

A second aspect according to the first aspect, wherein the filter material comprises a polyol ligand comprising three or more hydroxyl groups.

A third aspect according to the second aspect, wherein the polyol ligand has 4 or 5 hydroxyl groups.

A fourth aspect according to the second or third aspect, wherein the polyol ligand is an amino polyol ligand.

A fifth aspect according to the fourth aspect, wherein the amino polyol ligand is selected from the group consisting of 1-aminopentane-1,2,3,4,5-pentol, 1-(methylamino)hexane-1,2,3,4,6-pentol, 5-(methylamino)hexane-1,2,3,4,6-pentol, 6-aminohexane-1,2,3,4,5-pentol, 5-(methylamino)hexane-1,2,3,4,6-pentol, 6-(methylamino)hexane-1,2,3,4,5-pentol (n-methylglucamine), 1-deoxy-1-(methylamino)-D-glucitol), and 6-(butylamino)hexane-1,2,3,4,5-pentol.

A sixth aspect according to the first aspect, wherein the filter comprises a polyphosphonic acid ligand.

A seventh aspect according to the sixth aspect, wherein the polyphosphonic acid ligand is a diphosphonic acid ligand.

An eighth aspect according to the sixth or seventh aspect, wherein the polyphosphonic or diphosphonic acid ligand is an amino polyphosphonic acid ligand or amino diphosphonic acid ligand.

A ninth aspect according to the sixth aspect, wherein the polyphosphonic acid ligand is selected from the group consisting of 1-(aminoethylidene)-1,1-diphosphonic acid, 4-amino-1-hydroxybutane-1,1-biphosphonic acid (alendronic acid), (4-amino-1,1,1-trihydroxy-2-phosphonobutan-2-yl)phosphonic acid, (1-amino-1,1-pentanediyl)bis(phosphonic acid), (1-amino-1,1-heptanediyl)bis(phosphonic acid), (1-amino-1,3-propanediyl)bis (phosphonic acid), iminodi(methylphosphonic acid), [amino(phosphono)methyl]phosphonic acid, diethylenetriaminepentakis(methylphosphonic acid), and nitrilotri(methylphosphonic acid).

A tenth aspect according to any of the previous aspects, comprising both the polyol ligand and polyphosphonic acid ligand.

An eleventh aspect according to any of the previous aspects, wherein the filter material is in the form of a porous polymeric filter membrane.

A twelfth aspect according to the eleventh aspect, wherein the porous polymeric filter membrane has a bubble point in a range from about 2 psi to about 400 psi.

A thirteenth aspect according to the eleventh or twelfth aspect, wherein the porous polymeric filter membrane has a pore size from about 0.001 microns to about 10 microns.

In a fourteenth aspect, a composite membrane comprises a first filter material having at least one of (a) a polyol ligand comprising three or more hydroxyl groups or (b) a polyphosphonic acid ligand; and a second filter material different from the first filter material, wherein the composite membrane is configured to be used in conjunction with a microelectronic fabrication system, for providing a metal- or metal ion-depleted liquid composition.

A fifteenth aspect according to the fourteenth aspect, wherein the second filter material is different from the first filter material in that the second filter material has the one of (a) a polyol ligand comprising three or more hydroxyl groups or (b) a polyphosphonic acid ligand not present in the first filter material.

A sixteenth aspect according to the fourteenth or fifteenth aspect, wherein the first filter material is a porous polymeric material.

A seventeenth aspect according to any of the fourteenth through sixteenth aspects, wherein the second filter material is a porous polymeric material.

An eighteenth aspect according to any of the fourteenth through sixteenth aspects, wherein the second filter material is polymeric resin particles.

In a nineteenth aspect, a microelectronic fabrication system comprises the filter material of any one the first through thirteenth aspects, or the composite membrane of any one of the fourteenth through eighteenth aspects.

A twentieth aspect according to the nineteenth aspect, further comprising (a) an aqueous basic composition supply, (b) an aqueous acid supply, or both (a) and (b).

In a twenty-first aspect, a method for removing one or more metal(s) or metal ion(s) from a liquid composition, wherein the method comprise: contacting a filter material with a liquid composition comprising one or more metal or metal ions, the filter material comprising (a) a polyol ligand comprising three or more hydroxyl groups, (b) a polyphosphonic acid ligand, or both (a) and (b), wherein contacting reduces an amount of the one or more metal or metal ions in the liquid composition.

A twenty-second aspect according to the twenty-first aspect, wherein the filter comprises a polyol ligand comprising three or more hydroxyl groups.

A twenty-third aspect according to the twenty-second aspect, wherein the amino polyol ligand has 4 or 5 hydroxyl groups.

A twenty-fourth aspect according to the twenty-second or twenty-third aspect, wherein the polyol ligand is an amino polyol ligand.

A twenty-fifth aspect according to the twenty-fourth aspect, wherein the amino polyol ligand is selected from the group consisting of 1-aminopentane-1,2,3,4,5-pentol, 1-(methylamino)hexane-1,2,3,4,6-pentol, 5-(methylamino)hexane-1,2,3,4,6-pentol, 6-aminohexane-1,2,3,4,5-pentol, 5-(methylamino)hexane-1,2,3,4,6-pentol, 6-(methylamino)hexane-1,2,3,4,5-pentol (n-methylglucamine), 1-deoxy-1-(methylamino)-D-glucitol), and 6-(butylamino)hexane-1,2,3,4,5-pentol.

A twenty-sixth aspect according to the twenty-first aspect, wherein the filter comprises a polyphosphonic acid ligand.

A twenty-seventh aspect according to the twenty-fifth aspect, wherein the polyphosphonic acid ligand is a diphosphonic acid ligand.

A twenty-eighth aspect according to the twenty-sixth or twenty-seventh aspect, wherein the polyphosphonic or diphosphonic acid ligand is an amino polyphosphonic acid ligand or amino diphosphonic acid ligand.

A twenty-ninth aspect according to the twenty-eighth aspect, wherein the polyphosphonic acid ligand is selected from the group consisting of 1-(aminoethylidene)-1,1-diphosphonic acid, 4-amino-1-hydroxybutane-1, 1-biphosphonic acid (alendronic acid), (4-amino-1,1,1-trihydroxy-2-phosphonobutan-2-yl)phosphonic acid, (1-amino-1,1-pentanediyl)bis(phosphonic acid), (1-amino-1,1-heptanediyl)bis(phosphonic acid), and (1-amino-1,3-propanediyl)bis(phosphonic acid).

A thirtieth aspect according to any of the twenty-first through twenty-ninth aspects, wherein the filter material comprises both a polyol ligand and a polyphosphonic acid ligand.

A thirty-first aspect according to any of twenty-first through thirtieth aspects, wherein the filter material comprises a polymeric material.

A thirty-second aspect according to any of the twenty-first through thirty-first aspects, wherein the filter material comprises a hydrophobic material.

A thirty-third aspect according to any of the twenty-first through thirty-second aspects, wherein the filter material comprises a polyolefin or a halogenated polymer.

A thirty-fourth aspect according to the thirty-third aspect, wherein the polyolefin is selected from the group consisting of polyethylene (PE), polypropylene (PP), polymethylpentene (PMP), polybutene (PB), polyisobutylene (PIB), and copolymers of two or more of ethylene, propylene, and butylene.

A thirty-fifth aspect according to the thirty-third aspect, wherein the halogenated polymer is selected from the group consisting of polytetrafluoroethylene (PTFE), polychlorotrifluoro-ethylene (PCTFE), fluorinated ethylene polymer (FEP), polyhexafluoropropylene, and polyvinylidene fluoride (PVDF).

A thirty-sixth aspect according to the thirty-first aspect, wherein the polymeric material is selected from the group consisting of polyamide, polyimide, polysulfone, polyethersulfone, and a combination thereof.

A thirty-seventh aspect according to any of the twenty-first through thirty-sixth aspects, wherein the filter material is in the form of a porous polymeric filter membrane.

A thirty-eighth aspect according to the thirty-seventh aspect, wherein the porous polymeric filter membrane has a bubble point in a range from about 2 psi to about 400 psi.

A thirty-ninth aspect according to the thirty-seventh or thirty-eighth aspects, wherein the porous polymeric filter membrane has a pore size from about 0.001 microns to about 10 microns.

A fortieth aspect according to any of the twenty-first through thirty-ninth aspects, wherein the liquid composition is an aqueous basic composition.

A forty-first aspect according to the fortieth aspect, wherein the liquid composition is an aqueous basic composition having a pH a range of 10-14.

A forty-second aspect according to the fortieth or forty-first aspect, wherein the aqueous basic composition comprises tetramethyl ammonium hydroxide (TMAH), tetrabutyl ammonium hydroxide (TBAH), $NH_4OH$, or a mixture thereof.

A forty-third aspect according to any of the twenty-first through thirty-ninth aspects, wherein the liquid composition is an aqueous acidic composition.

A forty-fourth aspect according to the forty-third aspect, wherein the liquid composition is an acidic composition having a pH of about 3 or lower.

A forty-fifth aspect according to the forty-third or forty-fourth aspect, wherein the acidic composition comprises HCl, $H_2SO_4$, $H_3PO_4$, $HNO_3$, or HF.

A forty-sixth aspect according to any of the forty-third through forty-fifth aspects, wherein the acidic composition has an acid concentration of at least 0.5% (w/v).

A forty-seventh aspect according to any of the twenty-first through thirty-ninth aspects, wherein the liquid composition is a solvent or mixture of solvents.

A forty-eighth aspect according to the forty-seventh aspect, wherein the liquid composition is an organic solvent or mixture of organic solvents.

A forty-ninth aspect according to any of the twenty-first through forty-eighth aspects, wherein the one or more metal or metal ions are selected from alkali earth metals, transition metals, and post transition metals.

A fiftieth aspect according to the forty-ninth aspect, wherein the one or more metal or metal ions are selected from Na, K, Al, Ca, Ti, Cr, Mn, Fe, and Zn.

A fifty-first aspect according to any of the twenty-first through fiftieth aspects, wherein the filter comprises a polyphosphonic acid ligand and a polyol ligand comprising four or five hydroxyl groups.

In a fifty-second aspect, a method for manufacturing a microelectronic device comprises performing the method of any of the twenty-first through fifty-first aspects to generate a metal- or metal ion-depleted liquid composition, and contacting a microelectronic article with the metal- or metal ion-depleted liquid composition in a step of manufacturing a microelectronic device.

A fifty-third aspect according to the fifty-second aspect, wherein contacting the metal- or metal ion-depleted liquid composition comprises an acid, and contacting is performed to wet etch a portion of the microelectronic device.

A fifty-fourth aspect according to the fifty-second aspect, wherein contacting the metal- or metal ion-depleted liquid composition comprises a base, and contacting is performed to remove photoresist in a semiconductor manufacturing process.

What is claimed is:

1. An ultra high molecular weight polyethylene (UPE) porous polymeric filter membrane comprising a polyol ligand having three or more hydroxyl groups and further comprising a polyphosphonic acid ligand selected from an amino polyphosphonic acid ligand or an amino diphosphonic acid ligand, wherein the porous polymeric filter membrane is configured to be used in conjunction with a microelectronic fabrication system for providing a metal- or metal ion-depleted liquid composition.

2. The porous polymeric filter membrane of claim 1, wherein the polyol ligand has 4 or 5 hydroxyl groups.

3. The porous polymeric filter membrane of claim 1, wherein the polyol ligand is an amino polyol ligand.

4. The porous polymeric filter membrane of claim 3, wherein the amino polyol ligand is selected from the group consisting of 1-aminopentane-1,2,3,4,5-pentol, 1-(methylamino)hexane-1,2,3,4,6-pentol, 5-(methylamino)hexane-1,2,3,4,6-pentol, 6-aminohexane-1,2,3,4,5-pentol, 5-(methylamino)hexane-1,2,3,4,6-pentol, 6-(methylamino)hexane-1,2,3,4,5-pentol (n-methylglucamine), 1-deoxy-1-(methylamino)-D-glucitol), and 6-(butylamino)hexane-1,2,3,4,5-pentol.

5. A method of removing one or more metal(s) or metal ion(s) from a liquid composition, the method comprising:
contacting an ultra high molecular weight polyethylene (UPE) porous polymeric filter membrane with a liquid composition comprising one or more metal or metal ions, wherein the porous polymeric filter membrane comprises a polyol ligand having three or more hydroxyl groups and further comprises a polyphosphonic acid ligand selected from an amino polyphosphonic acid ligand or an amino diphosphonic acid ligand, and reducing an amount of the one or more metal or metal ions in the liquid composition.

6. The method of claim 5, wherein the polyol ligand has 4 or 5 hydroxyl groups.

7. The method of claim 5, wherein the polyol ligand is an amino polyol ligand.

8. The method of claim 7, wherein the amino polyol ligand is selected from the group consisting of 1-aminopentane-1,2,3,4,5-pentol, 1-(methylamino)hexane-1,2,3,4,6-pentol, 5-(methylamino)hexane-1,2,3,4,6-pentol, 6-aminohexane-1,2,3,4,5-pentol, 5-(methylamino)hexane-1,2,3,4,6-pentol, 6-(methylamino)hexane-1,2,3,4,5-pentol (n-methylglucamine), 1-deoxy-1-(methylamino)-D-glucitol), and 6-(butylamino)hexane-1,2,3,4,5-pentol.

9. The method of claim 5, wherein the liquid composition is an aqueous basic composition having a pH in a range of about 10 to about 14.

10. The method of claim 5, wherein the liquid composition comprises TMAH, TBAH, ammonium hydroxide, or concentrated HCl having an HCl concentration of greater than 10%.

11. A composite membrane comprising:
a first filter material and a second filter material, wherein the first filter material, the second filter material, or both are an ultra high molecular weight polyethylene (UPE) porous polymeric filter membrane, an output facing surface of the first filter material in contact with an input facing surface of the second filter material,
wherein the first filter material or the second filter material comprises a polyol ligand having three or more hydroxyl groups and further comprising a polyphosphonic acid ligand selected from an amino polyphosphonic acid ligand or an amino diphosphonic acid ligand and the second filter material is different from the first filter material, and
wherein the composite membrane is configured to be used in conjunction with a microelectronic fabrication system for providing a metal- or metal ion-depleted liquid composition.

* * * * *